United States Patent
Hsu et al.

(10) Patent No.: US 7,079,997 B1
(45) Date of Patent: Jul. 18, 2006

(54) IC BEHAVIOR ANALYSIS SYSTEM

(75) Inventors: Yu-Chin Hsu, Cupertino, CA (US);
Furshing Tsai, San Jose, CA (US);
Yirng-An Chen, San Jose, CA (US);
Kunming Ho, Fremont, CA (US);
Tayung Liu, Sunnyvale, CA (US);
Chieh Changfan, Union City, CA (US);
Wells Woei-Tzy Jong, San Jose, CA (US)

(73) Assignee: Novas Software, Inc., San Jose, CA (US)

( * ) Notice: Subject to any disclaimer, the term of this patent is extended or adjusted under 35 U.S.C. 154(b) by 874 days.

(21) Appl. No.: 10/143,347

(22) Filed: May 10, 2002

Related U.S. Application Data

(63) Continuation-in-part of application No. 09/829,535, filed on Apr. 9, 2001, now Pat. No. 7,031,899.

(51) Int. Cl.
*G06F 17/50* (2006.01)

(52) U.S. Cl. .............................. 703/14; 703/15; 703/19

(58) Field of Classification Search .................. 703/14, 703/15, 16; 715/771; 716/6
See application file for complete search history.

(56) References Cited

U.S. PATENT DOCUMENTS 5,220,512 A * 6/1993 Watkins et al. ............... 716/11
5,634,003 A * 5/1997 Saitoh et al. ................. 703/15

* cited by examiner

*Primary Examiner*—Paul L. Rodriguez
*Assistant Examiner*—Jason Proctor
(74) *Attorney, Agent, or Firm*—Daniel J. Bedell; Smith-Hill and Bedell

(57) ABSTRACT

A debugger produces a display based on instructions executed by a circuit simulator or verification tool and on waveform data produced by the simulator or verification tool when executing the instructions. The instructions include a set of statements, each corresponding to a separate circuit signal generated by a circuit and each including a function defining a value of the circuit signal as a function of values of other circuit signals. The simulator evaluates the statements at various simulation times to compute signal values at those simulation times. The waveform data indicates signal values the simulator computes when evaluating the statements. The debugger display includes a set of statement event symbols, each corresponding to a separate evaluation of a statement and each positioned in the display to indicate a simulation time at which the simulator evaluated the statement. Each statement event symbol references the signal whose value is computed by the corresponding statement evaluation and indicates a value of that signal computed when the statement was evaluated. Each statement event symbol also references the other signals having values of which the statement indicates the computed signal value is a function and indicates those other signals values as of the simulation time at which the statement was evaluated.

26 Claims, 13 Drawing Sheets

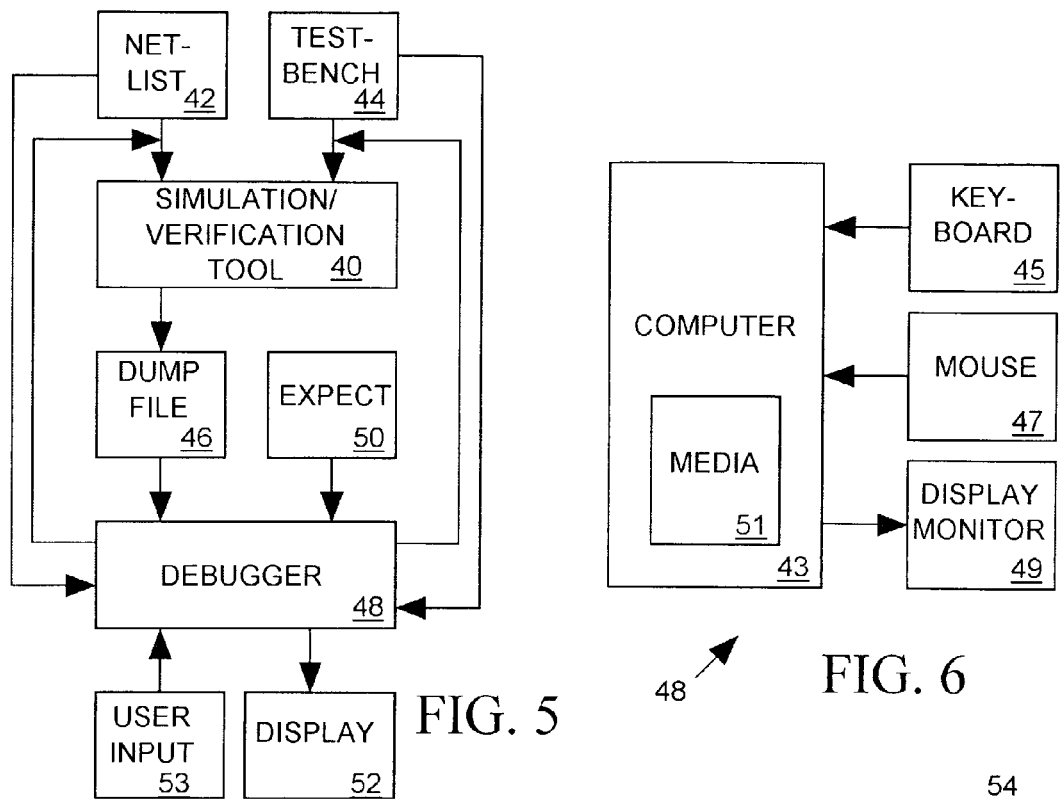
FIG. 5
FIG. 6
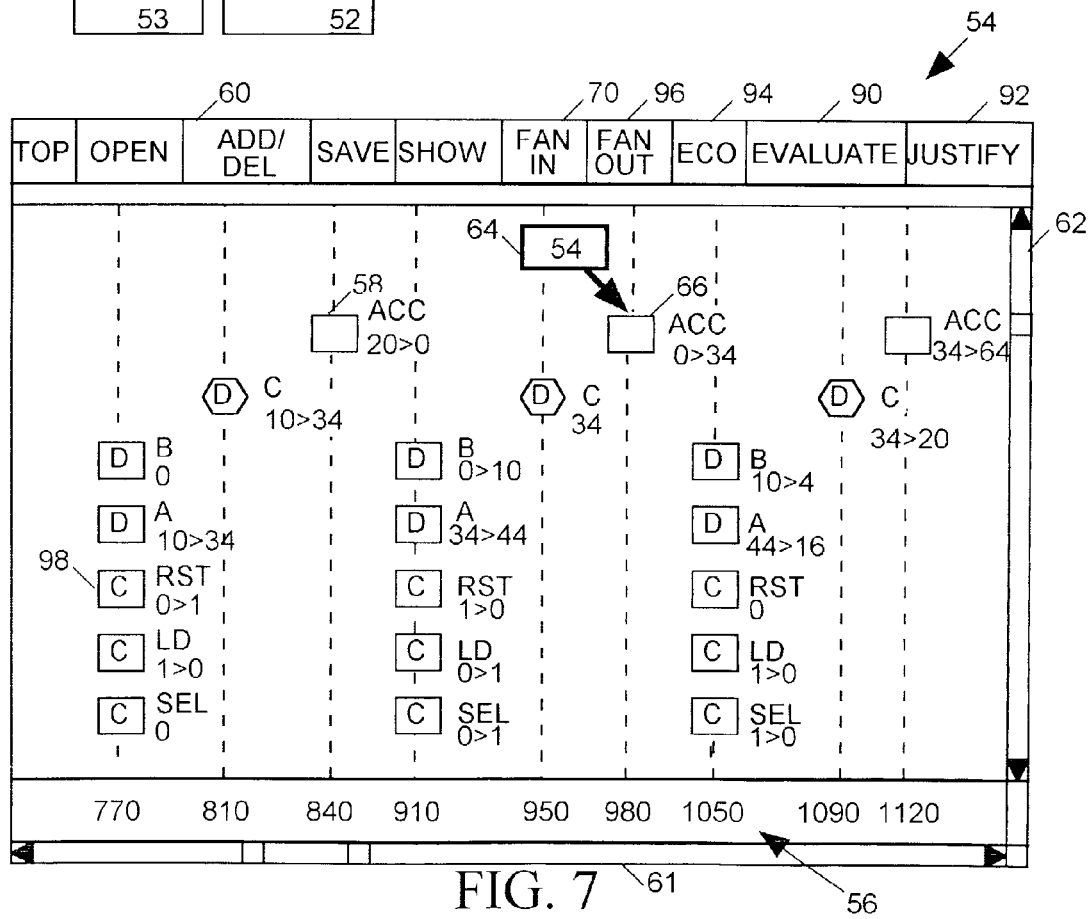
FIG. 7

IC BEHAVIOR ANALYSIS SYSTEM

CROSS-REFERENCE TO RELATED APPLICATIONS

The present application is a continuation-in-part of U.S. patent application Ser. No. 09/829,535, filed Apr. 9, 2001 now U.S. Pat. No. 7,031,899.

BACKGROUND OF THE INVENTION

1. Field of the Invention

The present invention relates in general to a debugging system for displaying waveform data produced by an integrated circuit simulator or verification tool and in particular to a debugging system that also graphically represents relationships between circuit behavior and structure to help a user analyze circuit behavior.

2. Description of Related Art

FIG. 1 is a schematic diagram modeling a portion of an integrated circuit (IC) receiving five input signals D–H produced by other modules of the circuit. A register 10 stores input signals D–H on an edge of an input clock signal CLK2 to produce a set of three control signals (RST, LD and SEL) and two 8-bit data signals (A and B) at the output of register 10. When SEL is low (0) an arithmetic logic unit (ALU) 12 adds A and B to produce output data C supplied as input to an accumulator 14 clocked by another input clock signal CLK1. When SEL is high (1) ALU 12 subtracts B from A to produce its output data C. Accumulator 14 increments its output value ACC by C in response to an edge of another clock signal CLK1 when the reset (RST) and load (LD) signals are both low. When RST is high, accumulator 14 sets its output equal to 0 and when LD is high, it sets its output signal equal to C. A register 16 stores the ACC signal on leading edges of the CLK2 signal to produce an output signal OUT.

While the schematic model of the circuit of FIG. 1 helps people understand the structure of the circuit, an integrated circuit (IC) designer typically creates a text-based "netlist" circuit model written in a hardware description language that can be processed by various computer-aided design (CAD) tools, including a circuit simulator that can simulate how an IC described by a netlist would behave over time in response to a set of input signals.

As illustrated in FIG. 2, an IC designer programs a simulator 18 with instructions including a netlist 17 describing an IC to be simulated and a "testbench" file 20 describing how the circuit's input signals vary with time during the simulation. Simulator 18 then simulates the response of the circuit to the input signals described by testbench 20 and produces a "dump file" 22 containing a set of waveform data sequences, each describing how a separate one of the IC's input or generated signals varies with time. A debugger 24 then generates a display 26 of the waveform data results of the simulation included in dump file 22.

FIG. 3 illustrates an example waveform display 26 that debugger 24 might produce based on waveform data a simulator 18 might write to a dump file 22 while simulating a circuit including the circuit module of FIG. 1. The waveform display of FIG. 3 shows how input clock signals CLK1 and CLK2 and generated control and data signals SEL, LD, RST, A, B, C, and ACC signals vary with time. Debugger 24 may allow a user to provide "expect" data 28 as input indicating expected values of various signals at selected times so that the debugger may flag any signal that fails be of an expected value at an expected time. In FIG. 3 a flag 30 indicates that the ACC data signal was expected to transition to a value 54 at a time 980 when it actually transitioned to value 34.

The dump file 22 that simulator 18 produces, and the waveform display 26 debugger 24 derives from the dump file, are behavioral models of the circuit, describing how a circuit behaves by describing how the signals it receives and generates behave. But the dump file and the waveform display say nothing about the structure of the circuit or how the signals are interrelated. Thus while the waveform display of FIG. 3 can tell a designer that the ACC signal has an unexpected value at time 980, the waveform display alone does not provide the designer much help in determining the cause of the problem; it can't tell him why the ACC signal had value 34 after time 980 instead of its expected value 54 because it does not include any information relating the behavior of the ACC signal to the behavior of any other signal.

To understand why the ACC signal changed to value 34 at time 980, the designer will typically review not only the behavioral model of the circuit (the waveform display), but also a structural model of the circuit (the netlist or schematic). For example, netlist 17 or the schematic of FIG. 1 would tell the designer that the value of the ACC signal following an edge of the CLK1 signal is a function of values of signals C, LD, RST and ACC when the CLK1 edge occurred. The designer could determine by looking at the netlist and the waveform display that C had value 34 and the LD signal was high (1) at time 980 when CLK1 clocked accumulator 14, so that the accumulator output ACC would have been set equal to C at that time. Thus the designer might concluded that the error may have arisen because C had the wrong value at time 980 or because the LD signal was incorrectly asserted at time 980.

To investigate whether the error in ACC arose from an error in the C signal, the designer could determine from the netlist that ALU 12 produces its output data signal C as the sum of data signals A and B when SEL is low and as the difference of A and B when SEL is high. From the waveform display of FIG. 3, the designer would see that at time 980, A and B had values 44 and 10, respectively, and that SEL was high. Thus ALU 12 would have subtracted 10 from 44 to generate a C signal having value 34. Noting that the expected value of ACC, and therefore the expected value of C at time 980 should have been 54, the designer might suspect that the SEL control signal should have been low instead of high at time 980 so that B would be added to A instead of subtracted from A, thereby causing C to transition to 54 instead of remaining at 34. The designer might also wonder whether A should have transitioned to 64 at time 980. The designer would then go on to investigate the structure and behavior of the circuit module producing the F and G signals from which the SEL and A signals are derived, perhaps to discover a logic error in that module. However the source of an error in waveform data is not always so easy to find.

Netlist 17 provides an instruction statement for each signal generated by the IC indicating that the value of the signal is a function of one or more other of the circuit input or generated signals, and that the statement is to be periodically evaluated on each edge of a clock signal. For example the statement defining the behavior of accumulator 14 of FIG. 1 would describe the value to which the ACC output of the accumulator should be periodically set as a function of its own current value and the values of RST, LD and C, and the statement would indicate that it is to be evaluated on each edge of the (simulated) CLK1 signal.

A simulator's evaluation of a netlist statement, thereby setting the value of an IC signal at a particular simulation time, is herein defined as a "statement event". FIG. 4A graphically illustrates how statement events relate to one another. An output signal value generated during a statement event 32 at a time 100 is a logical function of data values generated during statement events 33 and 34 occurring at earlier times 90 and 80. Signal values acting as inputs to statement events 33 and 34 are in turn generated as outputs of several statement events occurring at still earlier times 80 and 70. Note that the "fan-in cone" formed by statement events having an influence on the output value of statement event 32 at time 100 grows rapidly as the designer looks farther back in time. When an identified error in a signal value produced by statement event has its roots in statement events occurring far back in time from the identified error event, designers can find the problem of locating the cause of an error to be tedious and complex.

In addition to determining how a signal came to have a particular value at a particular time, a designer might like to determine how a change in a value of a signal at a particular time might affect values of other signals at later times. For example, looking at the waveform displays of FIG. 3, the designer might want to know what would happen if the RST signal value stayed low at time 770 instead of going high for one CLK2 cycle. What other signals would be affected during next N clock cycles, and how would they be affected? FIG. 4B illustrates a "fan-out" cone indicating how a signal value generated by a statement event 36 occurring at time 40 can affect values generated by an increasingly larger number of statement events as time passes. While a designer might be able to determine how a change in the data value produced by a particular statement event might affect outputs of statement events for the next few clock cycles, the process can become increasing difficult as the designer's investigation continues to move forward in time, particularly when the effects of the statement event fan out as illustrated in FIG. 4B.

A designer might also like to know how a change in a statement defining a portion of the logic of a circuit might affect some small portion of circuit behavior, but that can be difficult for a designer to determine without modifying the netlist and re-running the entire simulation, which can be time-consuming.

What is needed is a debugger that can provide a user with a better picture of the relationship between circuit structure and circuit behavior, that can help the designer to quickly determine and visualize how a change in a signal value output of a statement event affect signal value outputs of later statement events.

BRIEF SUMMARY OF THE INVENTION

Computer readable media in accordance with the invention contains a program for execution by a conventional computer capable of receiving user input and of producing displays on a display monitor based on instructions supplied as input to a circuit simulator and on waveform data output of the circuit simulator. The simulator instructions include a set of statements, each defining a value of a corresponding signal that the circuit generates (the "statement output signal") as a function of values of one or more of values of circuit input signal or other signals the circuit generates (the "statement input signals". The simulator evaluates each statement at one or more times during the simulation to compute the value of the statement's output signal at those simulation times. The waveform data output of the simulator indicates the signal values the simulator computes by evaluating the statements. Each evaluation of a statement by the simulator is herein defined as a "statement event".

The display produced by the computer based on the simulator's input instructions and on the simulator's output waveform data includes a set of statement event symbols, each corresponding to a separate statement event, and each positioned in the display to indicate a simulation time at which the statement event occurred. Each statement event symbol references the corresponding statement's input signals, indicates their values at that simulation time, references the statement output signal and indicates its value as computed during the statement event.

The program executed by the computer includes an "evaluate" function which allows a user to alter a displayed statement event symbol to change an indicated value of a generated signal. The evaluate function then automatically determines how that signal value change would affect generated signals values indicated by other displayed statement event symbols and updates the displayed signal values accordingly.

The program also includes a "justify" function which also allows a user to alter a statement event symbol to change an indicted value of a generated signal. The justify function then automatically determines how signal values represented by the other displayed statement event symbols could be altered to justify the user-altered generated signal value and updates the displayed signal values accordingly.

The program further includes and "engineering change order" (ECO) function that allows a user to alter a statement associated with any displayed statement event symbol to change how the statement's output signal value logically relates to the statement's input signal values. The ECO function then automatically updates the display to indicate how the signal values represented by the displayed statement event symbols would be affected by the altered statement.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWINGS

FIG. 5 is a block diagram depicting a circuit simulation and debugging system in accordance with the invention;
FIG. 6 is a block diagram of the debugger of FIG. 5;
FIG. 7 depicts a top level display in accordance with the invention generated by the debugger of FIG. 5.

DETAILED DESCRIPTION OF THE INVENTION

Figure 1:
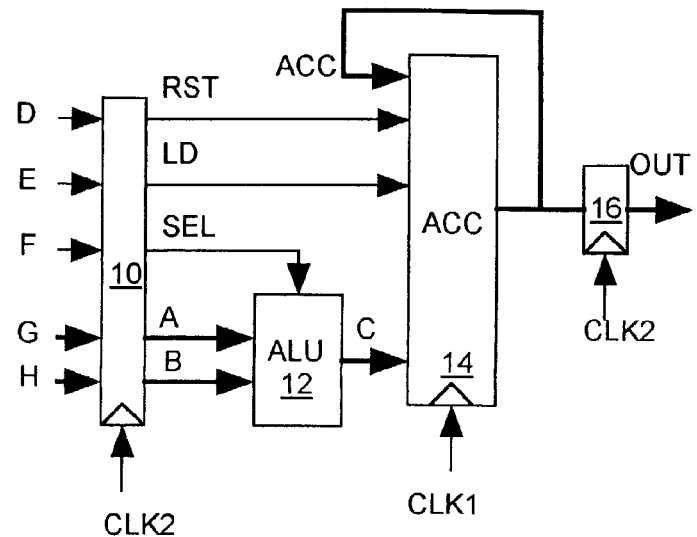
FIG. 1 is a schematic diagram modeling a portion of an integrated circuit (IC)
Figure 2:
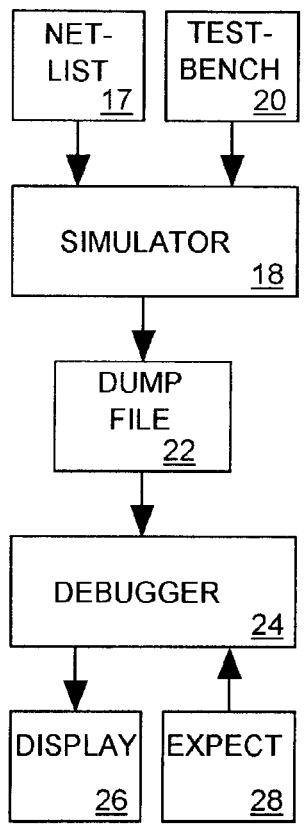
FIG. 2 is a block diagram depicting a prior art circuit simulation and debugging system.

The present invention is directed to computer readable media storing software which when read and executed by a conventional computer causes the computer to display and analyze results of an integrated circuit (IC) simulation. While the specification describes an exemplary embodiment and application of the invention considered by the applicants to be a best mode of practicing the invention, it is not intended that the invention be limited to the exemplary embodiment or to the application described below.

Various types of prior art computer-based IC simulation and verification tools known in the art generate waveform data representing the time-varying behavior of an integrated circuit in response to input instructions that model circuit. As illustrated in FIG. 5, a conventional IC simulation or verification tool 40 processes a model of a circuit, such as a netlist 42, and a model of the time-varying behavior of the circuit's input signal, such as a testbench file 44, to produce a model of the time-varying behavior of the signals the circuit would generate in response to its input signals. In the example of FIG. 5, the simulation or verification tool 40 generate a dump file 46 containing waveform data representing values of the circuit's input signals, internal signals and output signals at a succession of times. Netlist 42 includes an instruction statement for each signal generated by the circuit indicating that the value of the signal is a function of one or more other of the circuit input or generated signals and that the statement is to be evaluated as specific simulations.

As illustrated in FIG. 6, debugger 48 includes a conventional computer 43 having keyboard 45 and mouse 47 input, capable of controlling a display on a display monitor 49 and capable of reading and executing software and of reading and writing to reading data files stored on computer-readable media 51. The computer-readable media 51 stores software for programming computer 43 to carry out the functions of debugger 48 described herein below. Other software stored on computer-readable media 51 may program computer 43 to also function as simulation or verification tool 40, though a separate computer may be used to implement tool 40. Suitable computer-readable media 51 for storing programs and data files 42, 44, 46 and 50 of FIG. 5 include, but are not limited to, compact disks, floppy disks, hard disks, and random access or read only memory.

FIG. 1 is a schematic diagram modeling a portion of an example integrated circuit (IC) that an IC designer might want to simulate or verify. Five input signals D–H produced by other modules of the circuit are loaded into a register 10 on an edge of an input clock signal CLK2 to produce a set of three clocked control signals (RST, LD and SEL) and two 8-bit data signals (A and B) at the output of register 10. When SEL is low (0), an arithmetic logic unit (ALU) 12 adds A and B to produce output data C supplied as input to an accumulator 14 clocked by another input clock signal CLK1. When SEL is high (1) ALU 12 subtracts B from A to produce its output data C. Accumulator 14 increments a value ACC by C in response to each leading edge of clock signal CLK1 when its reset (RST) and load (LD) signals are both low. When RST is high, accumulator 14 sets its output equal to 0 and when LD is high, it sets its output signal equal to C in response to CLK1 signal edges. A register 16 stores the ACC signal on leading edges of the CLK2 signal to produce an output signal OUT.

A netlist 42 describing the circuit of FIG. 1 at the same level of detail as the schematic of FIG. 1 would employ a separate statement to describe the logic producing each generated signal RST, LD, SEL, A, B, C, ACC and OUT. For example the statement defining the behavior of accumulator 14 of FIG. 1 would describe the value to which the ACC output of the accumulator should be periodically set as a function of its own current value and the values of RST, LD and C, and the netlist would indicate that the statement is to be evaluated on each edge of the (simulated) CLK1 signal. A statement defining the RST signal would indicate that the RST signal is to be set to the current value of signal D and the netlist would indicate that the statement is to be evaluated on each leading edge of the CLK2 signal. The statement corresponding to the C signal output of ALU 12 would describe C as a function of A, B and SEL. Though ALU 12 is not directly clocked, the statement describing C may, for example, indicate a time delay with which C is to be evaluated following an edge of the CLK2 clock signal which clocks state changes in its input signals. The time delay is selected to match a predicted inherent signal path delay through ALU 12.

Figure 3:
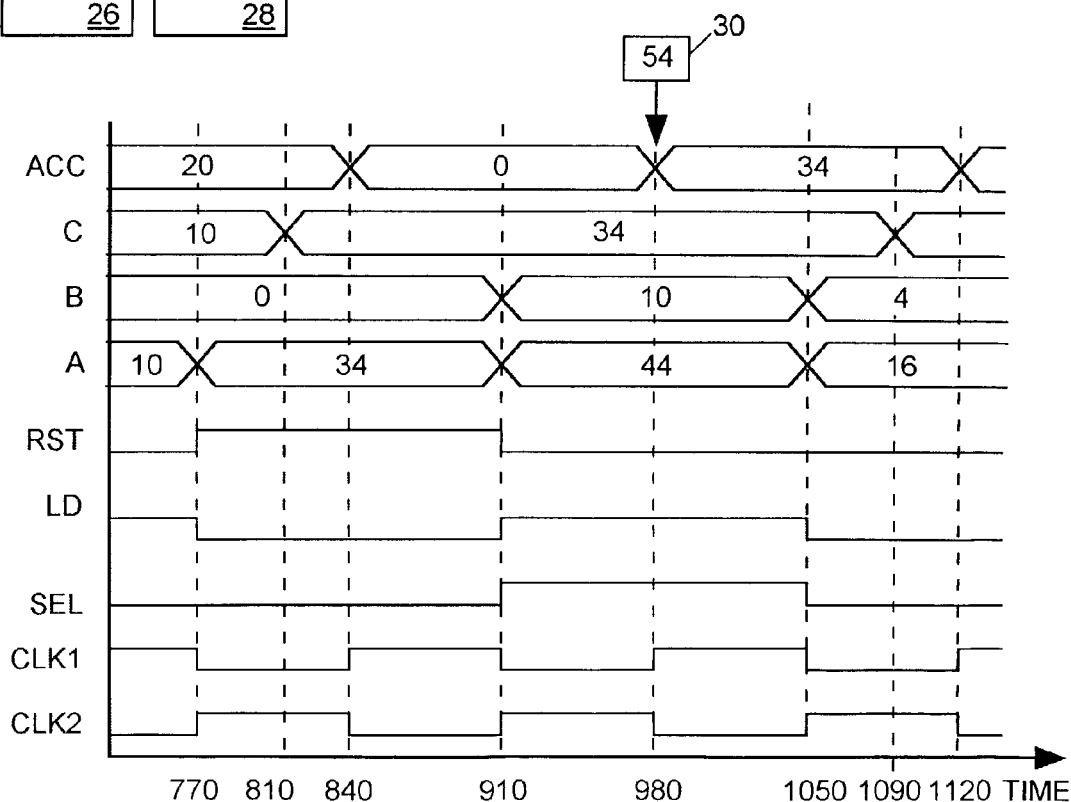
FIG. 3 illustrates an example prior art waveform display.
Figure 4A:
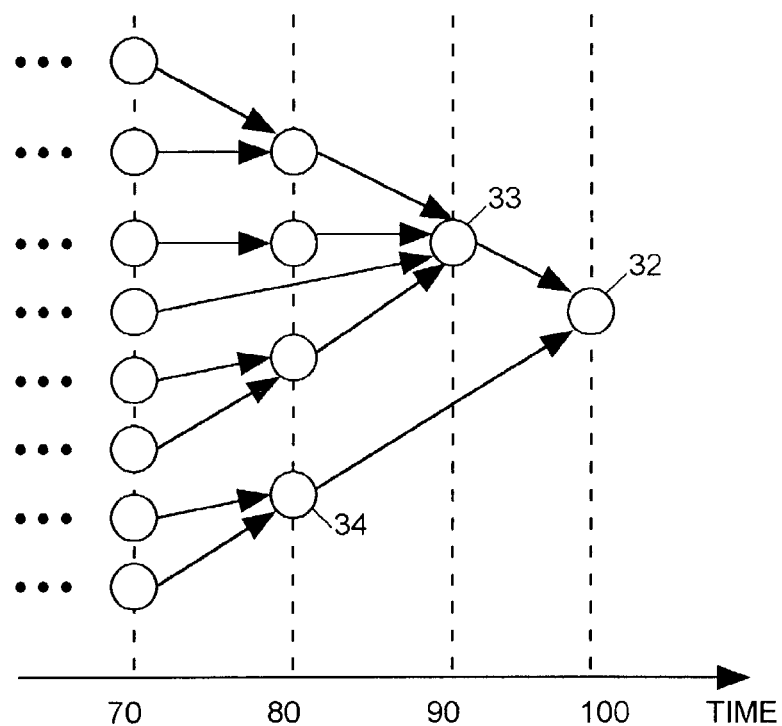
FIG. 4A is a graph of a statement event fan-in cone.
Figure 4B:
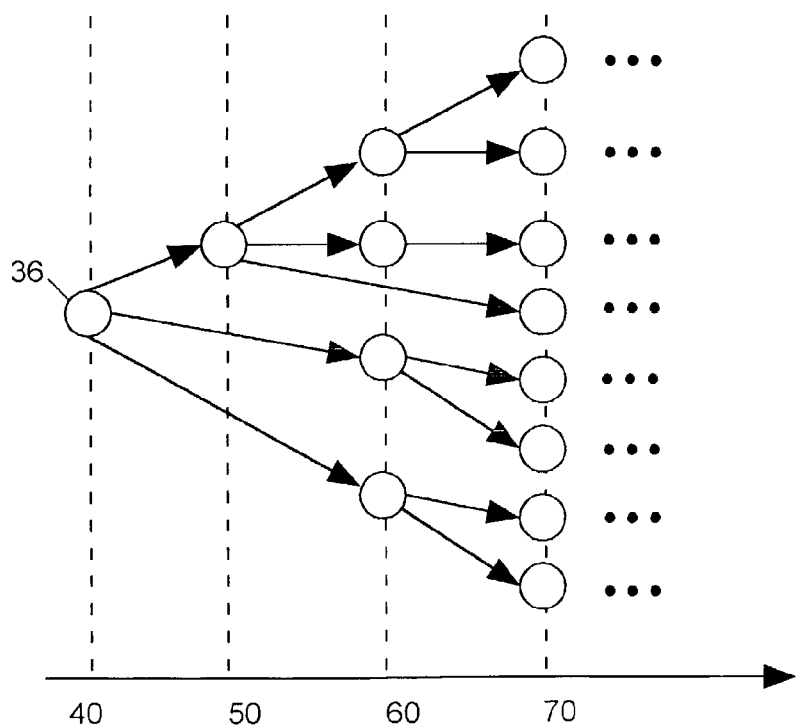
FIG. 4B is a graph of a statement event fan-out cone.

Netlist 42 is a structural model of an IC describing the logical interrelationships between its signals. While simulation or verification tool 40 can create a behavioral model (dump file 46) of the IC based on the structural model provided by netlist 42 and on the test bench description of the IC's input signal behavior, the netlist itself does not directly model IC behavior. Prior art debuggers typically generate timing diagram waveform displays similar to that illustrated in FIG. 3 graphically depicting how various signals of the circuit of FIG. 1 change with time. The display of FIG. 3 models the behavior of the circuit of FIG. 1 by describing the behavior its various input and generated signals as functions of time. However neither the timing diagram of FIG. 3 nor the waveform data produced by simulator or verification tool 40 of FIG. 6 provides any information about the logic carried out by the circuit. Thus while the waveform data and the waveform display model the behavior of the circuit, they tell us nothing about why circuit signals behave as they do or how the signals are logically related. To understand how the behavior of a circuit relates to its structure, designers usually find it necessary to examine and mentally correlate the structural (netlist) and behavioral (dump file or waveform display) models of the IC.

A debugger 48 in accordance with the invention generates displays 52 in response to user input 53 that graphically correlate the logic of the integrated circuit described by netlist 42 with the signal behavior described by dump file 46. Such displays enable a user to more easily visualize and comprehend how circuit structure affects signal behavior. Debugger 48 also provides software tools to help a user to see how the various signals represented by the waveform data affect one another over time and to enable the user to experimentally determine how circuit logic changes can affect circuit behavior.

Top Level Display

FIG. 7 depicts a display 54 debugger 48 produces based on the waveform data included in dump file 46 and on netlist 42 and testbench 44. Rather than representing only signal state changes, as does the timing diagram display of FIG. 3, display 54 provides a "statement flow graph" representing "statement events". Each evaluation of a netlist statement during the simulation or verification process in which a signal is evaluated at any particular simulation time is herein defined as a "statement event". A statement event may or may not result in a change to the value of signal.

In display 54 each box, such as box 58, represents a statement event and resides above a horizontal time base 56 to indicate the time the statement event occurred. Text next to the each box includes the name of the signal evaluated during the statement event. When the statement event changes the value of the signal, the text next to the box indicates the signal values before and after the statement event. When the statement event did not change value of a signal, the text indicates the value of the signal at the time of the statement event. A "D", "C" or "I" within a box indicates whether the signal is a data, control or circuit input signal. A rectangle box indicates that the signal is evaluated in response to an edge of a clock signal while a hexagonal box indicates the signal is evaluated with some delay after one or more of its input signals are evaluated. All statement event boxes relating to the same signal appear on the same row of the display. Display 54 shows that the RST, LD and SEL control signals may be high (1), or low (0), or may transition from high and low (1>0) or low to high (0>1) at various times and that the ACC, A, B and C data signals have or transition between certain numerical values at certain time. For example, the "20>0" text next to the box labeled "ACC" above time 840 indicates the ACC data signal value transitioned from 20 to 0 as a result of the statement event occurring at time 840.

A pull-down ADD/DEL menu 60 at the top of the display lists the signals for which waveform data is available and allows the user to toggle display of a signal by selecting the signal's name in menu 60. A horizontal scroll bar 61 permits the user to scroll time base 56 forward or backward in time and a vertical scroll bar 62 allows the user to scroll the display up or down to view signals when the screen is not large enough to show all times or signals currently included in the display.

As illustrated in FIG. 5, a user may supply an "expect" data file 50 as input to debugger 48 indicating values the user expects various signal to have at selected times. When the waveform data in dump file 46 indicates that a signal had a value other than an expected value, debugger 48 places a flag box 64 in the display indicating the expected value and pointing to a box 66 containing the unexpected value. In the example of FIG. 7 the ACC signal value transitioned to 34 at time 980 when the user expected it to transition to 54.

Fan-in Statement Event Display

The unexpected ACC signal value at time 980 may have arisen from a design flaw in netlist 42 or from a flaw in description of the circuit input signals supplied by test bench 44. Upon seeing flag 64 a designer would want to determine why the ACC signal A transitioned to value 34 at time 980. Responding to user input, debugger 48 can produce a "statement event fan-in/fan-out" display that eliminates the need for the user to look at the netlist to determine which signals affect the ACC signal. The display includes a curser (not shown) that a user can move about using mouse 47 of FIG. 6, and when the user points the curser at statement event box 66 and presses a mouse button (i.e., when the user "clicks on" box 66), debugger 48 highlights the box. When the user thereafter clicks on a FAN-IN button 70 above the display, debugger 48 produces the display illustrated in FIG. 8.

Figure 8:
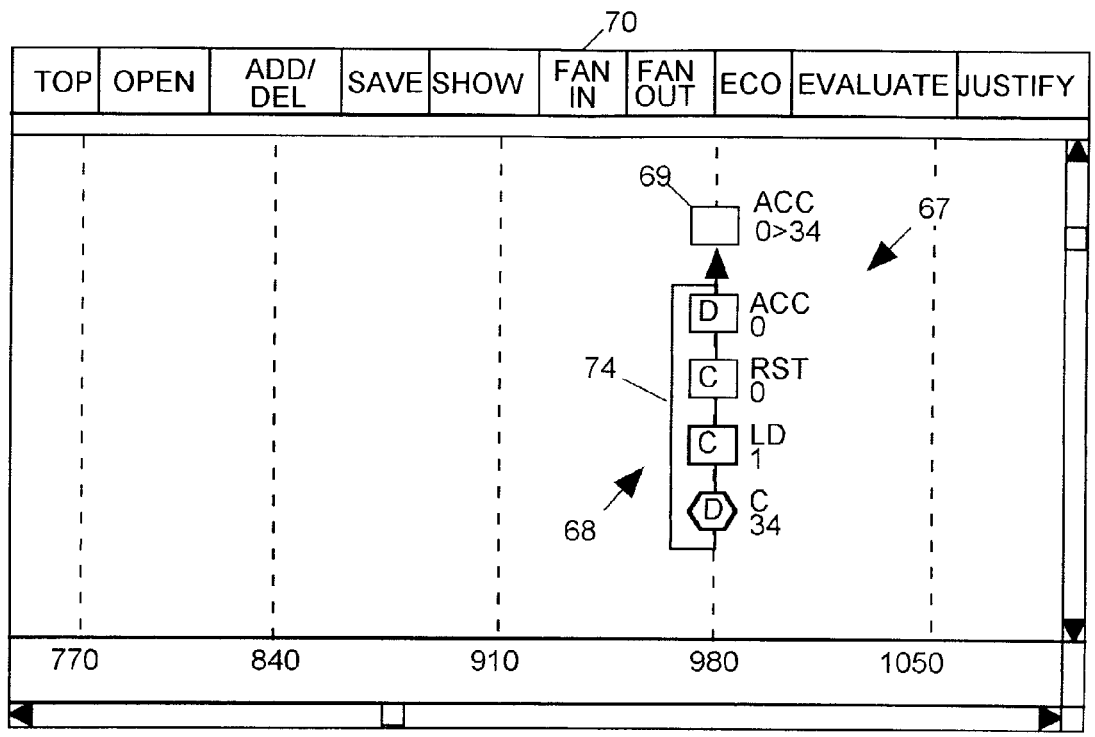
FIGS. 8–13 depict fan-in displays generated by the debugger of FIG. 5.

The display of FIG. 8 includes an expanded statement event symbol 67. Statement event symbol 67 represents an evaluation of the netlist statement in which the value of the statement's output signal ACC was calculated based on values of the statement's input signals ACC, RST, LD and C. The statement is evaluated in response to every leading edge of the CLK1 signal, but statement event symbol 67 represents only the particular evaluation of that statement occurring at simulation time 980. Positioned above time 980 to represent the simulation time at which the statement was evaluated, symbol 67 indicates that the statement defines the value of the ACC signal as a function of its own value and the values of three other signals RST, LD, C prior to statement evaluation. Statement event symbol 67 includes a box 69 representing the ACC signal with text next to the box indicating its name and transition values. Symbol 67 includes a set of four additional boxes 68 representing statement input signals C, RST, LD and ACC that affect the value of the ACC signal at time 980. Text next to boxes 68 indicates the name of corresponding signals C, RST, LD and ACC and their values at time 980. The shape of each box 68 indicates signal type. A rectangular box 68 (such as the boxes for the RST, LD and ACC signals) indicates that the signal is the output of a register or other clocked device, while a hexagonal box, such as the box for the C signal, indicates that the signal is the output of an unclocked device. As seen in FIG. 1, the C signal is the output of an unclocked ALU 12, the RST and LD signals are outputs of a register 10, and the ACC signal is produced by a clocked accumulator 14.

A "D" or a "C" in one of boxes 68 indicates that the signal is a data signal (D) that is used to compute the statement output value, or a control signal (C) that determines how the statement computes the output signal value from the data signal values. A box 68 that is highlighted indicates that the signal represented by the box influenced the outcome of the ACC statement event 69 at time 980. A box 68 is not highlighted when the corresponding signal did not influence the value of the ACC signal evaluated at time 980. Since at time 980 the LD signal had a value of 1, accumulator 14 updated its output ACC signal to match the value of its C input signal. The previous value of ACC and the value of RST had no influence on the value to which ACC transitioned at time 980. Thus the boxes 68 associated with the C and LD signals are highlighted while the boxes associated with the ACC and RST signals are not.

Thus the user may determine from statement event symbol 67 that 1. the statement controlling the ACC signal value was evaluated at time 980 and caused the ACC signal value to transition from 0 to 34, 2. the statement defines the ACC signal value as a function of the ACC, RST, LD and C signal values, 3. the ACC, RST, LD and C signal values were 0, 0, 1 and 34, respectively, when the statement was evaluated at time 980, 4. only the LD and C values happened to influence the ACC value during this particular evaluation of the statement, 5. the LD signal is a control signal that may have values of 0 or 1, and 6. the C signal is an unclocked data signal having a range other than just 0 and 1. (In alternative embodiments of the invention the text next to a box 68 or 69 may also indicate the name and/or numbers of signal bits or the signal's value range.)

From the display of FIG. 8 the user can see that the ACC signal transitioned to its unexpected value of 34 at time 980 as a result of a combination of values signals C, and LD prior to time 980. The user may therefore want to next determine how the LD signal came to have value 1 at time 980. To do so, the user clicks on box 74 causing debugger 48 to set the box to a highlight color indicating it has been selected. The user then again clicks FAN-IN button 70 causing debugger 48 add another statement event symbol 75 to the display as illustrated in FIG. 9.

Figure 9:
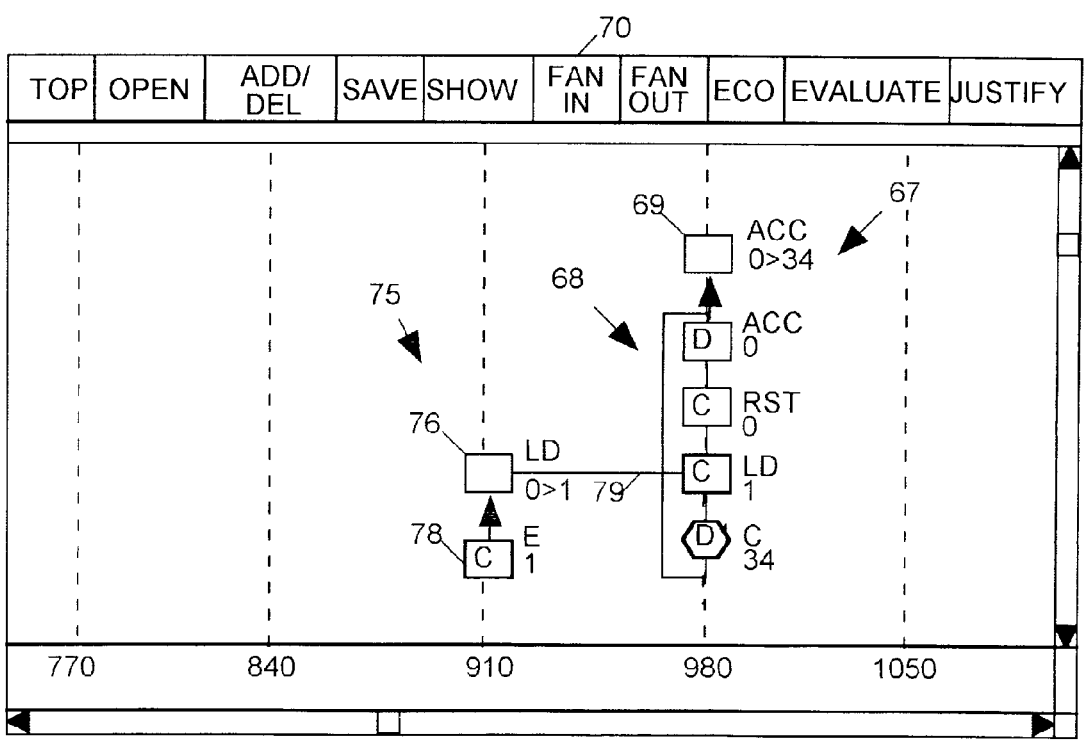

As shown in FIG. 9, statement event symbol 75 represents a statement evaluated at time 910 producing the LD signal value used during the statement event in which the simulator computed the ACC signal value at time 980. A box 76 labeled "LD" indicates that statement output signal LD transitioned from 0 to 1 at time 910 and a box 78 labeled "E" indicates that the E signal had a value 1 at time 910. An arrow extending from box 78 to box 76 indicates that the value to which the LD signal transitions at time 910 is a function of the E signal value at time 910. The "C" in box 78 indicates the E signal is a control signal and box 78 is highlighted to indicate that the E signal value influenced the value of the LD signal. A "fly-line" 79 links the LD statement signal output box 76 of statement event symbol 75 to the LD signal input box of statement event symbol 67 to indicate that the statement event represented by symbol 75 generated the LD signal value provided as input to the statement event represented by symbol 67.

Figure 10:
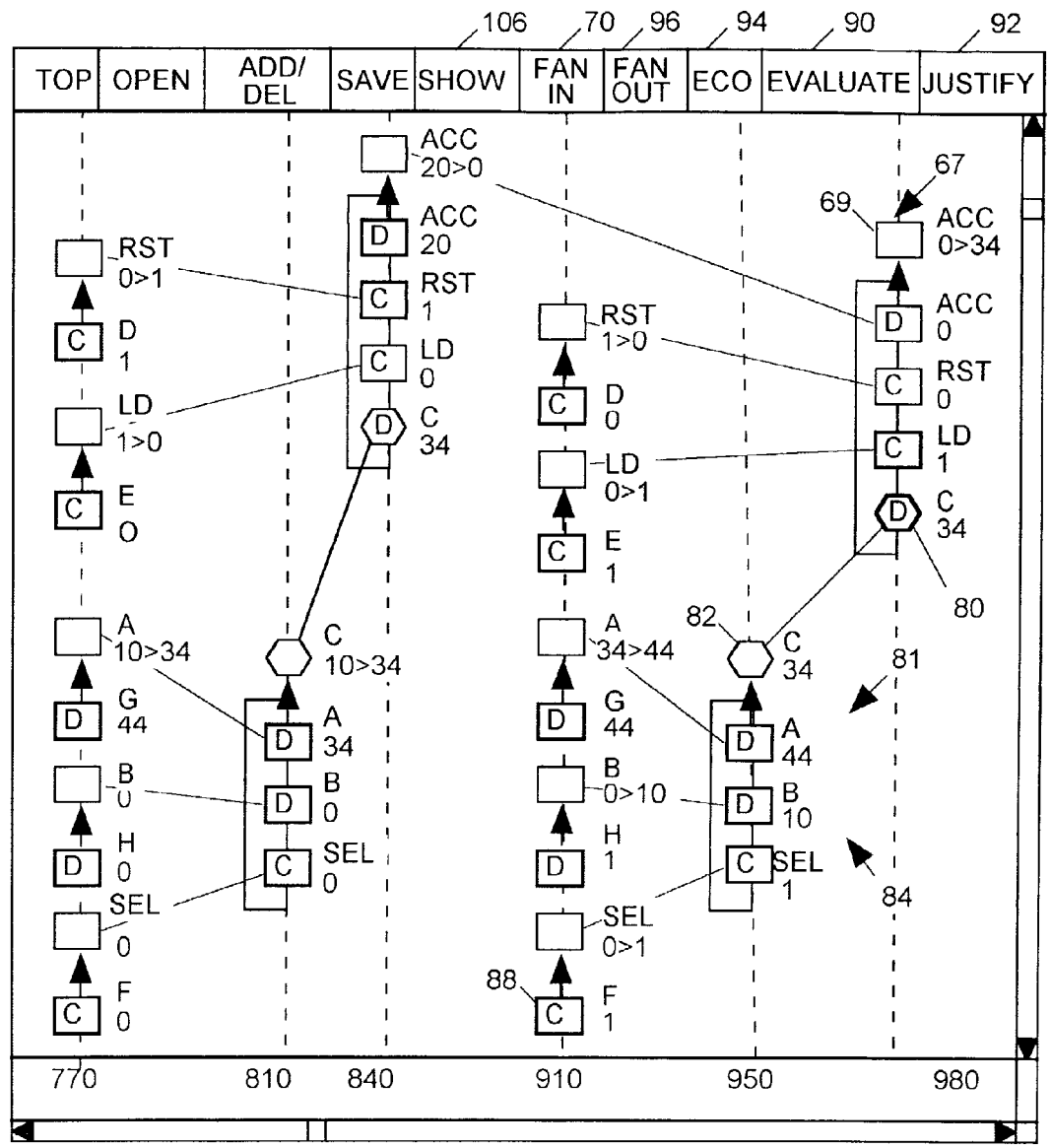

FIG. 10 illustrates a resulting fan-in display after the user has repeatedly used FAN-IN button 70 to expand the display to include symbols corresponding to several statement events in the fan-in code of statement event depicted by statement event symbol 67. For example, a fan-in expansion of the box 80 representing the C signal input to the accumulator at time 980 resulted in display of statement event symbol 81 at time 950 representing an evaluation of the statement implementing ALU 12 (FIG. 1) by representing the ALU output data C as a function of values of input signals A, B, and SEL. A fan-in expansion of the A, B and SEL boxes 84 of statement event symbol 81 resulted in display of a set of statement event symbols representing statements evaluated to calculate values of A, B and SEL at time 910.

The display of FIG. 10 provides the user with a graphical depiction of the statement event fan-in history of the statement event that set the ACC signal value at time 980. This kind of information is highly useful to a user interested in finding out what caused the ACC signal to transition to its unexpected value at time 980. It is the kind of information that the user could obtain by reviewing the prior art waveform display of FIG. 3 and the netlist describing the circuit, but only at the expense of much time and effort. Debugger 48 provides this information to the user quickly and presents it in a manner that is easy for the user to comprehend.

Evaluate Command

The display of FIG. 10 depicts how the module input signal values D–H occurring at times 770 and 910 affected the value of the ACC signal at time 980. Viewing the display, a user might want to know whether signal C might have transitioned to value 54 at time 980 if signal F had value 0 at time 910. To verify this, the user mouse clicks on box 88 representing the F signal at time 910. This highlights the text next to the box and enables the user to edit the displayed signal value using keyboard input to debugger 48 to change the selected text to indicate the F signal had value "0" instead of "1" at time 910. The user then presses an "EVALUATE" button 90 to send an "evaluate" command to debugger 48. Debugger 48 responds to the evaluate command by generating the display of FIG. 11.

Figure 11:
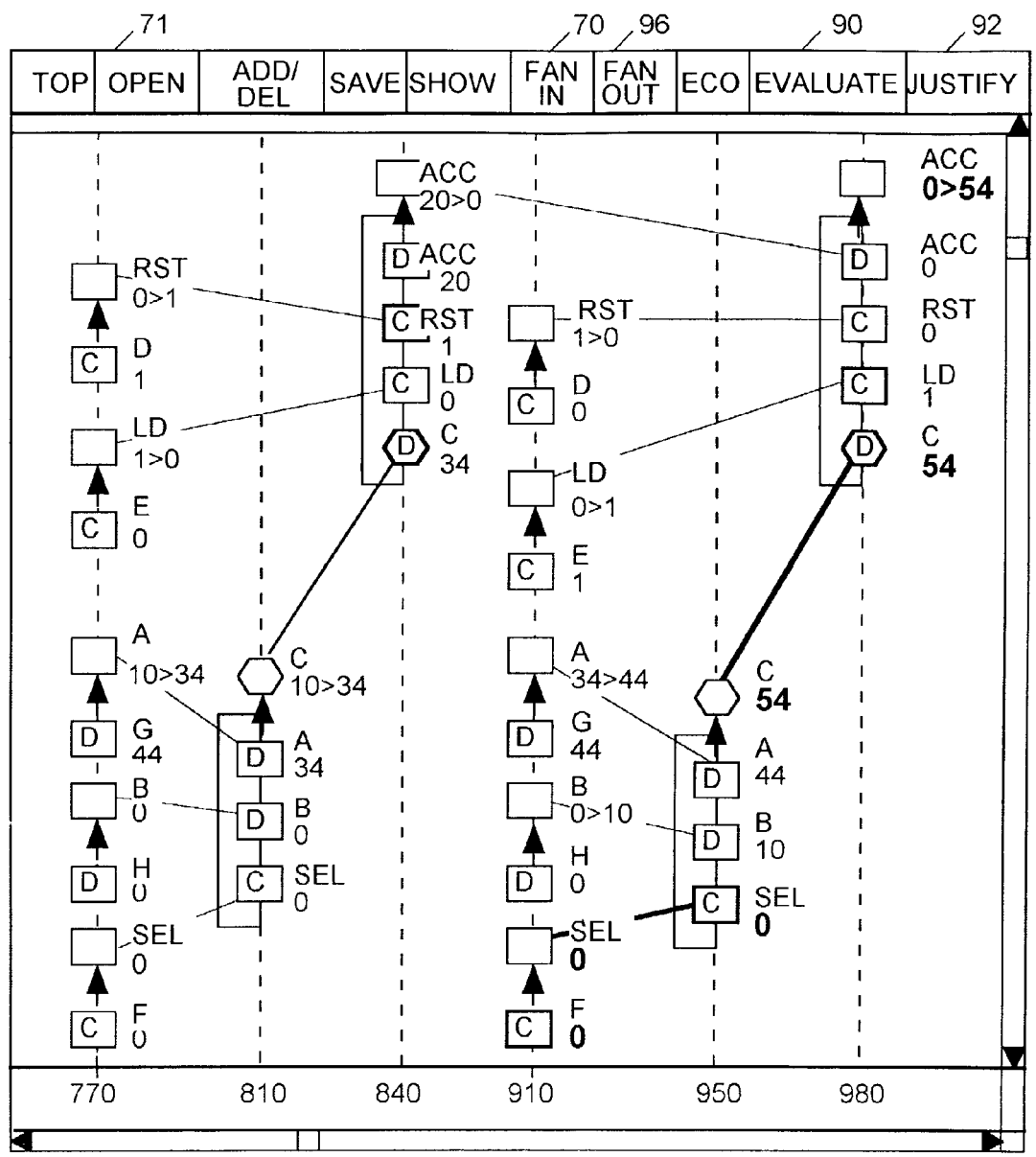

The display of FIG. 11 depicts how various statement event values displayed in FIG. 10 would appear had the F signal had value "0" instead of "1" at time 910. Boxes displaying signal values in the fan-out cone of the F signal at time 910 that change are highlighted with indicating colors as are fly-lines extending forward in time from changed boxes. In this case the display verifies the user's theory that a change in value of F at time 910 to 0 would indeed result in the correct ACC transition to 54 at time 980. This would lead the user to suspect that something may be wrong with the logic of the portion of the circuit producing the F signal and the user could decide to review statement events occurring before time 910 affecting the value of F at time 910 by using the fan-in button 70 to extend the fan-in display back in time from the F box at time 910.

Justify Command

The user might also wonder whether the value of F at time 910 may not be the only possible source of the error in the ACC signal at time 980. To look for other possible error sources, the user first clicks an OPEN button 71 which opens a dialog window containing a list of previous displays debugger 48 has produced. When the user selects the name of the display of FIG. 10 from the menu, the debugger 48 recreates that display.

Referring to FIG. 10, the user next clicks box 69 and edits the text "0>34" next to box 69 to read "0>54". The user then presses a JUSTIFY button 92 to send a "justify" command to debugger 48. The justify command tells debugger 48 to determine whether a change in value of any signal appearing at any time in display of FIG. 10 would result in the ACC signal having value 54 at time 980. In responding to the justify command, debugger 48 carries out a succession of evaluate operations, each based on the initial values of the statement events displayed in FIG. 10 with only one of the statement events having a changed value. The debugger 48 evaluates the effect of changing every independent signal variable to each of its possible values. A displayed signal value is considered an "independent" variable if no other signal value in the display can affect its value. The values of signals G–F at times 770 and 910 are the only independent signal variables in the display.

For example, the debugger would first assume that the value of D at time 770 is 0 instead of 1 and then determine whether the change in D had any effect on any other signal value in the display of FIG. 11. The debugger would then set the value of signal E at time 770 to its other possible value 1, while keeping all other independent signal variables at the values indicated in FIG. 11 and then determine the effects on other displayed signal values. Since signals A and B are 8-bit data words ranging in value between 0 and 255, debugger 48 would evaluate the results of setting each of the A and B signals at times 770 and 910 to each of their 255 possible values. In carrying out the justify command, debugger 48 would investigate the results of 126 different independent signal variable value changes to determine whether any of them would result in the value of ACC transitioning to 54 at time 980.

After debugger 48 has evaluated the effects on the value of ACC at time 980 of setting each signal D–H at times 770 and 910 to each of its possible values, the debugger provides a pop-up menu referencing each independent variable signal value, if any, that justified the ACC signal having value 54 at time 980. When the user selects an item listed on the menu, debugger 48 modifies the FAN-IN display to depict the results. One of the solutions the justify command returns is setting the value of F to 0 at time 910, as illustrated in FIG. 11, which the user previously verified using the EVALUATE command.

Figure 12:
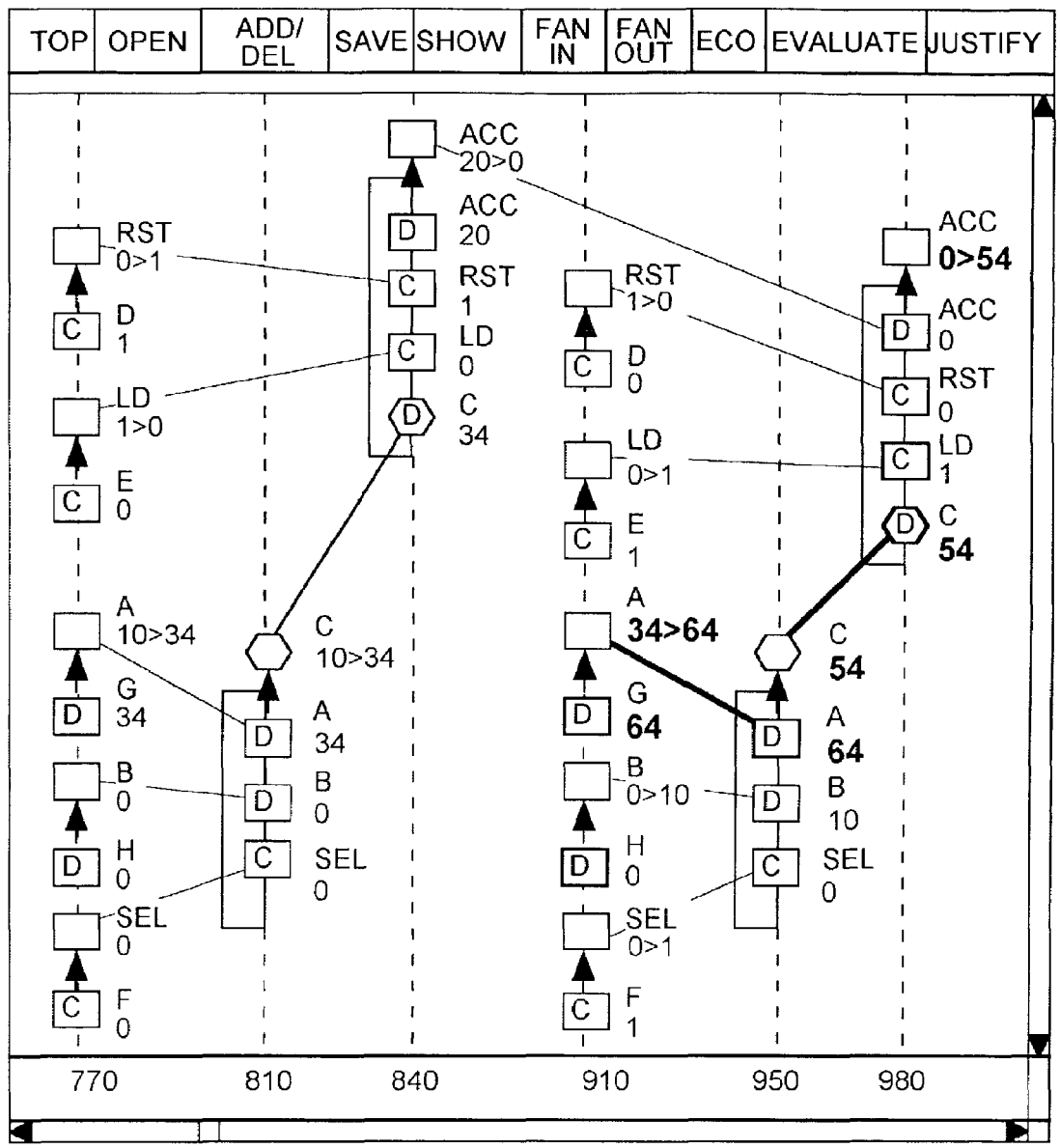

FIG. 12 depicts a display debugger 48 produces depicting another justify command solution. Here the value of A at time 910 transitions from 34 to 64 instead of from 34 to 44 as in FIG. 10. This causes C to have value 54 at time 980 instead of 34, thereby causing ACC to transition from 0 to 54 instead of from 0 the 34 at time 980. This solution would lead the user to suspect that the problem may have arisen from the portion of the IC that generates the A signal at time 910. The user might then want to create a fan-in display going back in time from A signal value at time 910.

Engineering Change Order

Referring again to FIG. 10, the user might suspect that an error in the value of ACC at time 980 may have arisen from an error in the logic of one of the netlist statements associated with one of the statement event symbols in the display of FIG. 10. When the user selects a statement event symbol by clicking on any box of a statement event symbol and then clicks an ECO ("engineering change order") command button 94, debugger 48 opens a text editing window displaying a netlist statement associated with the selected statement event symbol. The user may then edit the statement to alter the function by which it relates its statement output signal value to its statement input signal values. Debugger 48 thereafter evaluates the effect of the changed statement on the signals indicated by displayed statement event symbols representing statement events that are in the fan-out cone of the selected statement event, and then updates the fan-in display accordingly.

Figure 13:
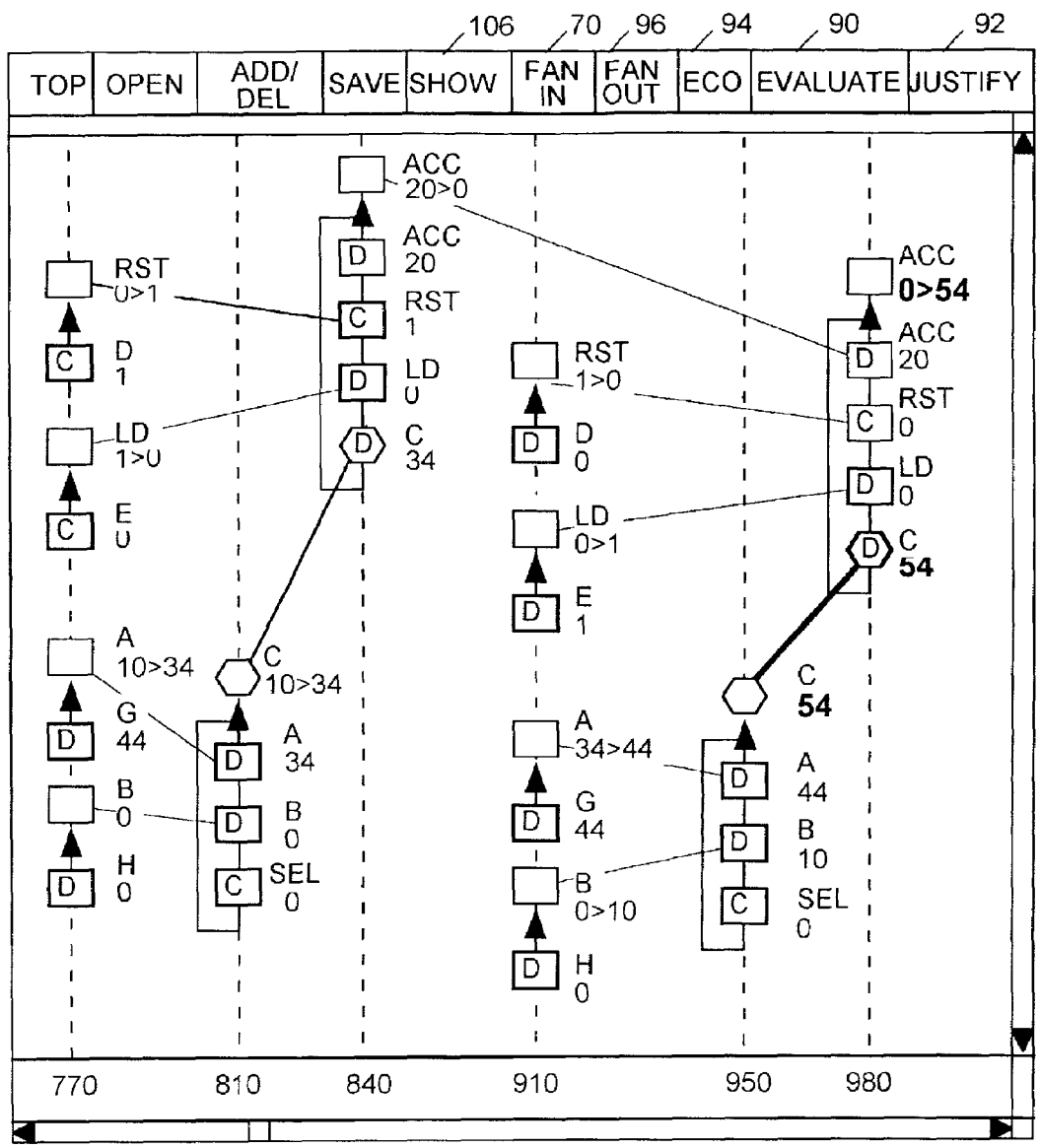

For example, when the user wants to see the effects of converting ALU 12 of FIG. 1 into an adder, the user clicks on box 82 of FIG. 10 to select the statement event at time 980 and then presses ECO button 94. Debugger 48 then displays an edit window containing the netlist text describing the circuit module including ALU 12. The user then edits the text defining ALU 12 to convert it into an adder. After the user presses an "ACCEPT" button in the text editor, debugger 48 closes the edit window and generates the display depicted in FIG. 13. Note that debugger 48 has removed the boxes associated with the F and SEL signals because in converting ALU 12 into an adder, the user deleted the SEL signal. Note also that the values of C and ACC at time 980 of FIG. 13 have been changed to reflect the effects of the change in circuit logic. The display shows that converting the ALU into an adder produces the desired result in the value of ACC at time 980.

Fan-Out

Figure 14:
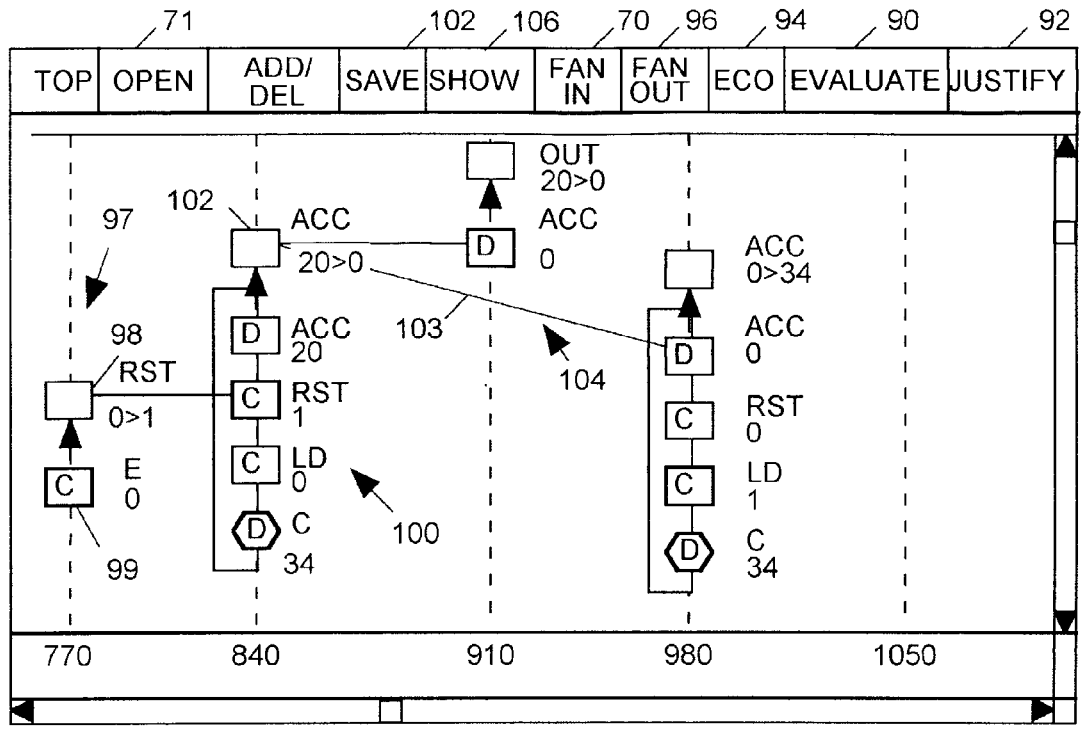
FIG. 14 depicts a fan-out display generated by the debugger of FIG. 5.

Referring again to FIG. 7, display 54 also includes a FAN-OUT button 96 in addition to FAN-IN button 70. For example when the user selects statement event symbol output box 98 representing the value change in the LD signal at time 770, and then presses FAN-OUT button 96, debugger 48 produces a fan-out display as illustrated in FIG. 14, initially including only a statement event symbol 97 positioned above time 770 and including output box 98 and input box 99. When the user again selects box 98 and presses FAN-OUT button 96, debugger 48 adds another statement event symbol 100 including an output signal box 102 representing an accumulator statement evaluated at time 840 for which the RST signal value generated at time 770 acts as an input. Had the RST signal value generated at time 770 acted as input to other statement events, debugger 48 would have placed additional statement event symbols representing those statement events in the display of FIG. 14.

The user might next select the box 102 representing the ACC output of accumulator 14 at time 840 and again press FAN-OUT button 96. Debugger 48 responds by adding a statement event symbol 104 at time 910 representing a statement event which loaded the ACC signal generated at time 840 into register 16 of FIG. 1. Debugger 48 also displays a statement event symbol 106 representing a statement event which set the value of ACC at time 980 in response to the value of ACC set at time 840. Fly-lines 103 show that statement event 102 fans out to both statement events 104 and 106. A user may invoke both FAN-OUT and FAN-IN commands to produce a display showing both fan-out and fan-in cones.

To save the current display so that it may be recalled later, the user presses a SAVE button 102 telling debugger 48 to open a dialog window allowing the user to name the display and to indicate the debugger is to store data representing the current state of the display. The user may later employ the OPEN button 71 to open a menu listing the saved display, select the name of one of the saved displays, and then command the debugger to restore the selected saved display.

Temporal Schema Display

Figure 15:
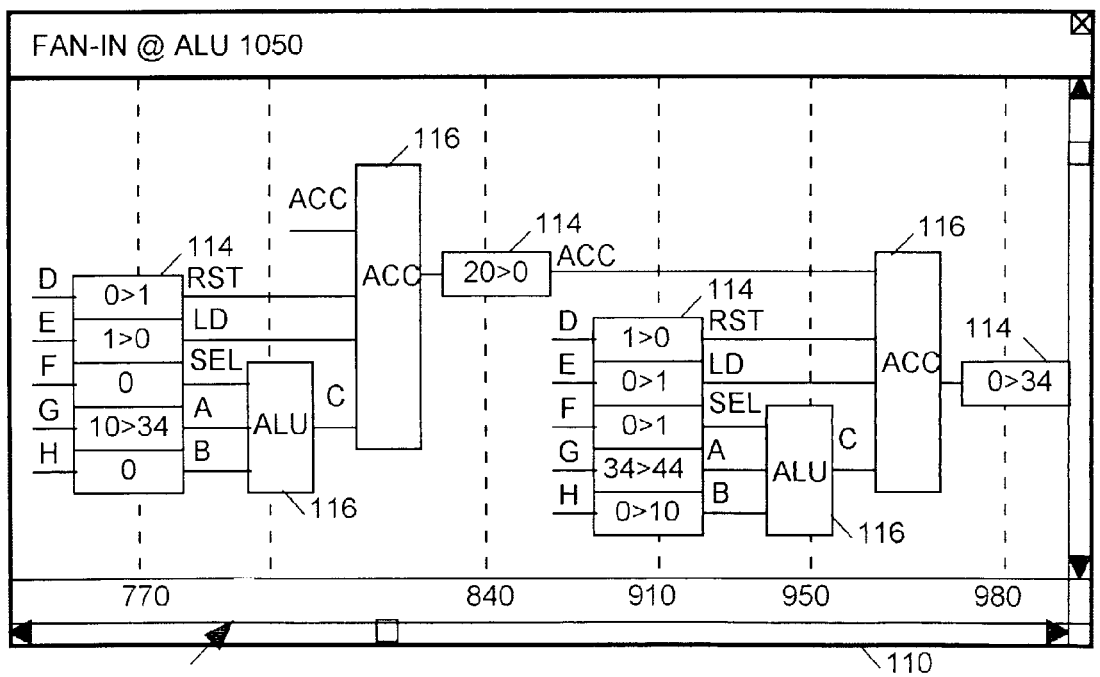
FIG. 15 depicts a temporal schema display generated by the debugger of FIG. 5.

A SHOW button 106 commands debugger 48 to generate a "temporal schema" display in a pop-up window depicting both the values of signals at various times and the logic interrelating the signals. FIG. 15 is an example of a temporal schema display debugger 48 would produce when the user presses SHOW button 106 while the debugger is producing the display of FIG. 10. The display of FIG. 15 includes boxes 114 depicting values of all register output signals appearing in FIG. 10 at points along a horizontal time scale 115 at which the registers are clocked. The display also includes boxes 116 representing the logic statements that interrelate the register signals. The name of the statement appears in the box. When the user clicks on a representation 116 of a statement, the debugger opens a window displaying the text of the statement.

Bus Contention

Figure 16:
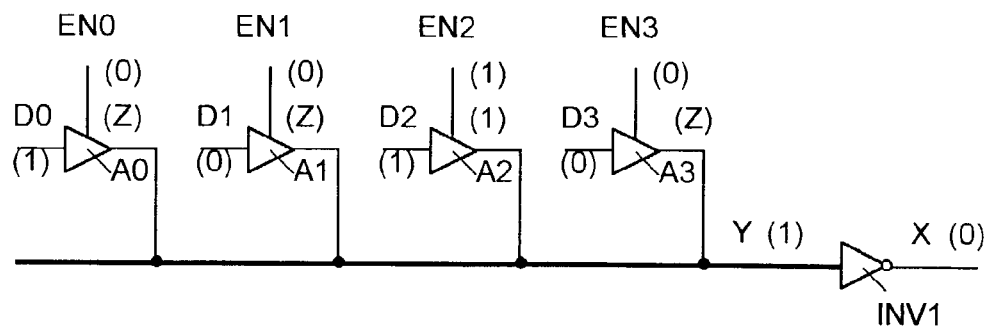
FIG. 16 depicts a circuit including a bus driven by four drivers.
Figure 17:
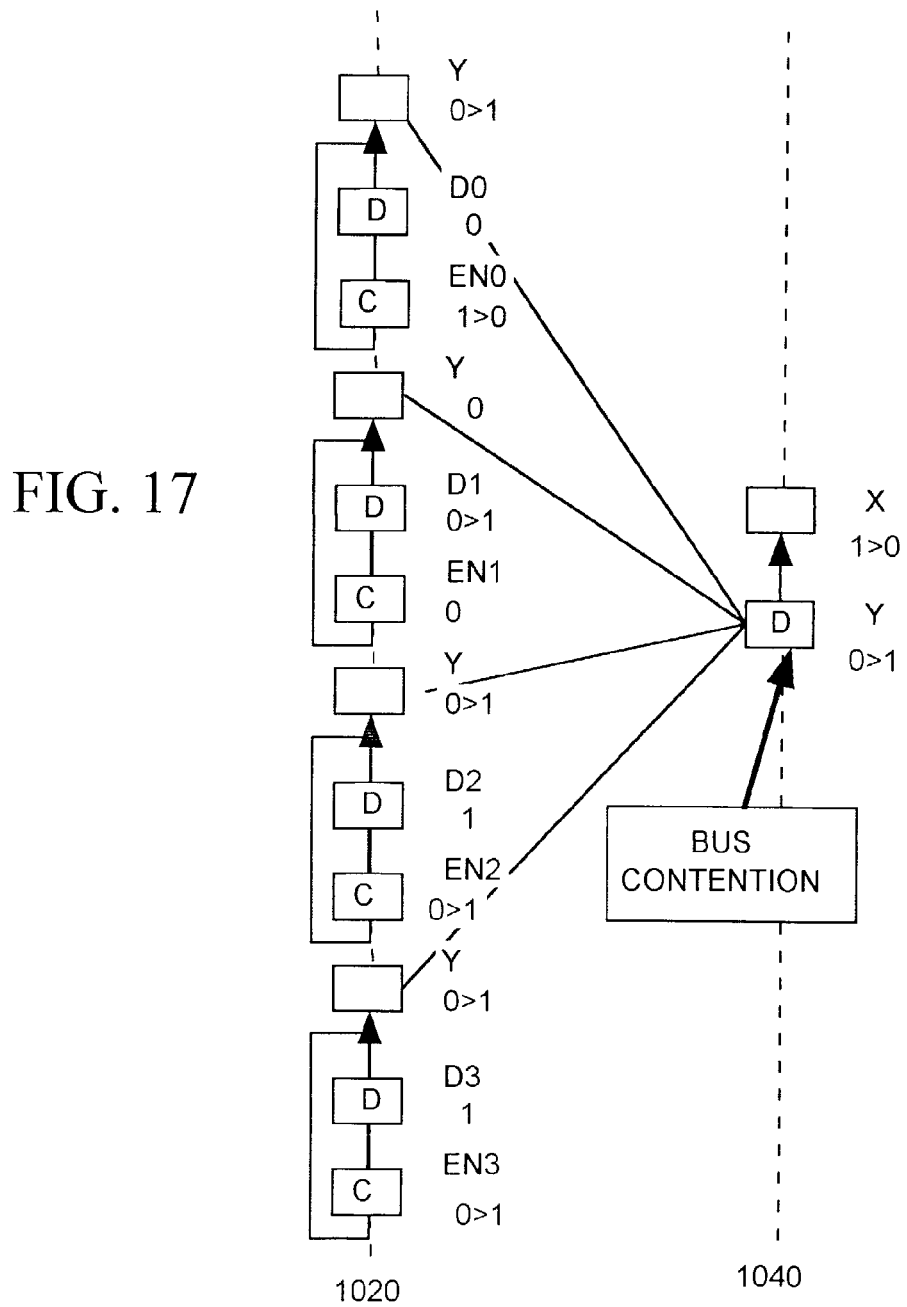
FIG. 17 depicts a fan-in display for the circuit of FIG. 16.

FIG. 16 illustrates a circuit in which outputs of a set of four tristate drivers A0–A3 are connected a common bus line Y supplied as input to an inverter INv1 producing output signal X. Driver A0 drives the bus line y to the state (0 or 1) of its input data input D0 when the driver's enable signal EN0 is high (1) and tristates its output (neither drives the Y signal high or low) when its enable signal EN0 is low (0). Drivers A1–A3 respond in a similar manner to their input data and enable signals D1–D3 and EN1–E3. Thus the output of any drier A0–A3 may be a 1, a 0 or may be tristated (z). Normally Only one of drivers A0–A3 should be output enabled at any given time. However in the example of FIG. 17 represent a bus contention error occurring at a time when both drivers A2 and A3 are output enabled and both drive bus Y to a 1, the state of the drivers' input signals D2 and D3.

The dump file 46 of FIG. 5 would not separately indicate which outputs of the four drivers A0–A3 are tristated and which are not. The dump file would only indicate the output of every driver is at state 1, since all driver outputs are connected to bus Y. Thus it would not be easy for one to determine by looking at a waveform display whether there is a bus contention problem. However the behavior analysis system in accordance with the invention displays a separate statement for each bus driver and provides a pop-up warning when it detects a bus contention problem For example a fan-in operation carried out on the Y input to inverter INV1 of FIG. 16 at time 1040 produces the display of FIG. 17. The fan-in display shows that four different statements executed at time 1020 control the state change in bus signal Y a time 1040. Each statement relates to a separate one of drivers A0–A3 and shows the states of its input data and enable signals. When a bus contention situation arises, the system produces a "bus contention" flag pointing to the Y signal box at time 1040 indicating that a bus contention issue exists with relation to bus signal Y. The includes a rule checker that displays the bus contention warning whenever it detects more than one enabled tristate buffer linked to a common output bus.

Arrays

A netlist may organize a set of words into an array and reference elements of the array using an index. For example, a two-dimensional array may be declared as a set of words, ARRAY[0], ARRAY[1], . . . ARRAY[n], where each word contains, for example, 32 bits. However during a logic simulation, a conventional simulator 40 of FIG. 5 will not output the contents of two-dimensional arrays into dump file 46 because two-dimensional arrays can be too large. Thus it is not possible for the debugger system to determine the value of an array element by reading only the contents of dump file 46. However the behavior analysis system of the present invention reads the HDL design and analyzes causes-and-effects of two-dimensional array read/write operations to determine when a two dimensional array element was written, and also analyzes circuit behavior to determine the value of the array element at that time. This enables debugger 48 to display the value of a two-dimensional array element even though it does not appear in dump file 46.

Figure 18:
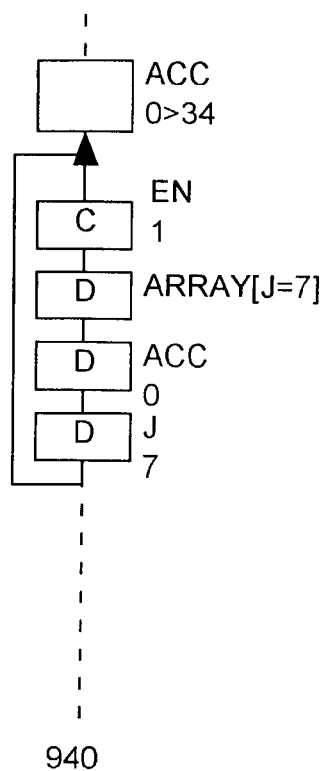
FIGS. 18 and 19 depict fan-in displays for a circuit having signals depicted as two dimensional array elements.

For example FIG. 18 illustrates a statement display debugger 48 of FIG. 5 would produce for a device having as one data input the signal conveyed by the Jth element ARRAY[J] of an array "ARRAY[ ]". The value of index J is determined by another data signal supplied as input to the device. Since the value of element ARRAY[J=7] is not independently available in dump file 46, its value is not displayed.

Figure 19:
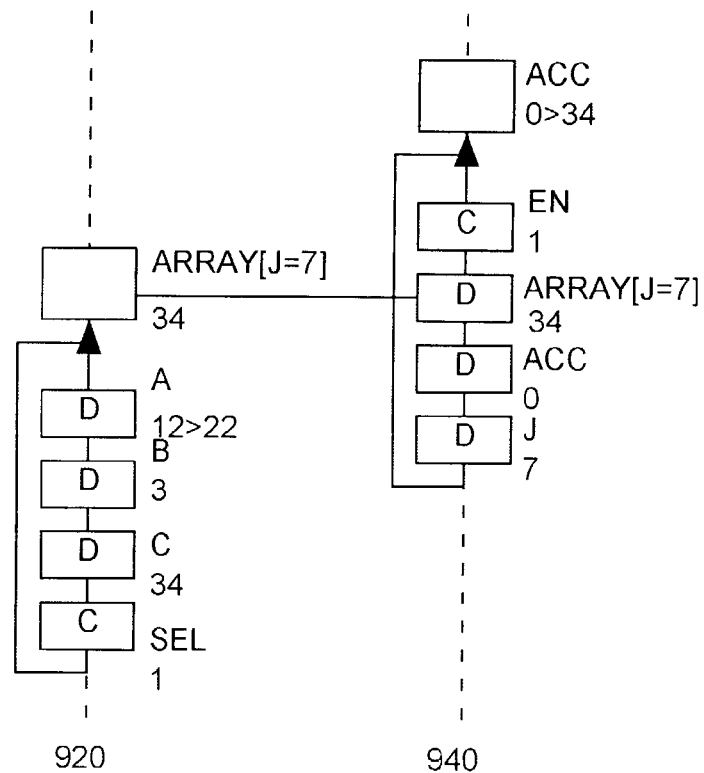

In order to determine the value of element ARRAY[j=7] at the time 940 of interest, the user can select the box representing that element and initiate a fan-in operation. The debugger then analyzes the netlist 42 to locate the statement controlling the value of ARRAY[j=7] and to determine the time (920) at which the value of ARRAY[j=7] acquired the value it had at time (940). The debugger then produces the display of FIG. 19 showing a representation of the statement that set the value of ARRAY(J=7) at a time (920). The debugger consults the dump file to determine the values of all of the signals (A, B, C and SEL) controlling the value of ARRAY[J=7] and evaluates the statement for ARRAY[J=7] to determine the value the array element took on at time 920. The system is then able to display the value (34) of array element ARRAY[J=7] at both times 920 and 940.

Debugger Architecture

Figure 20:
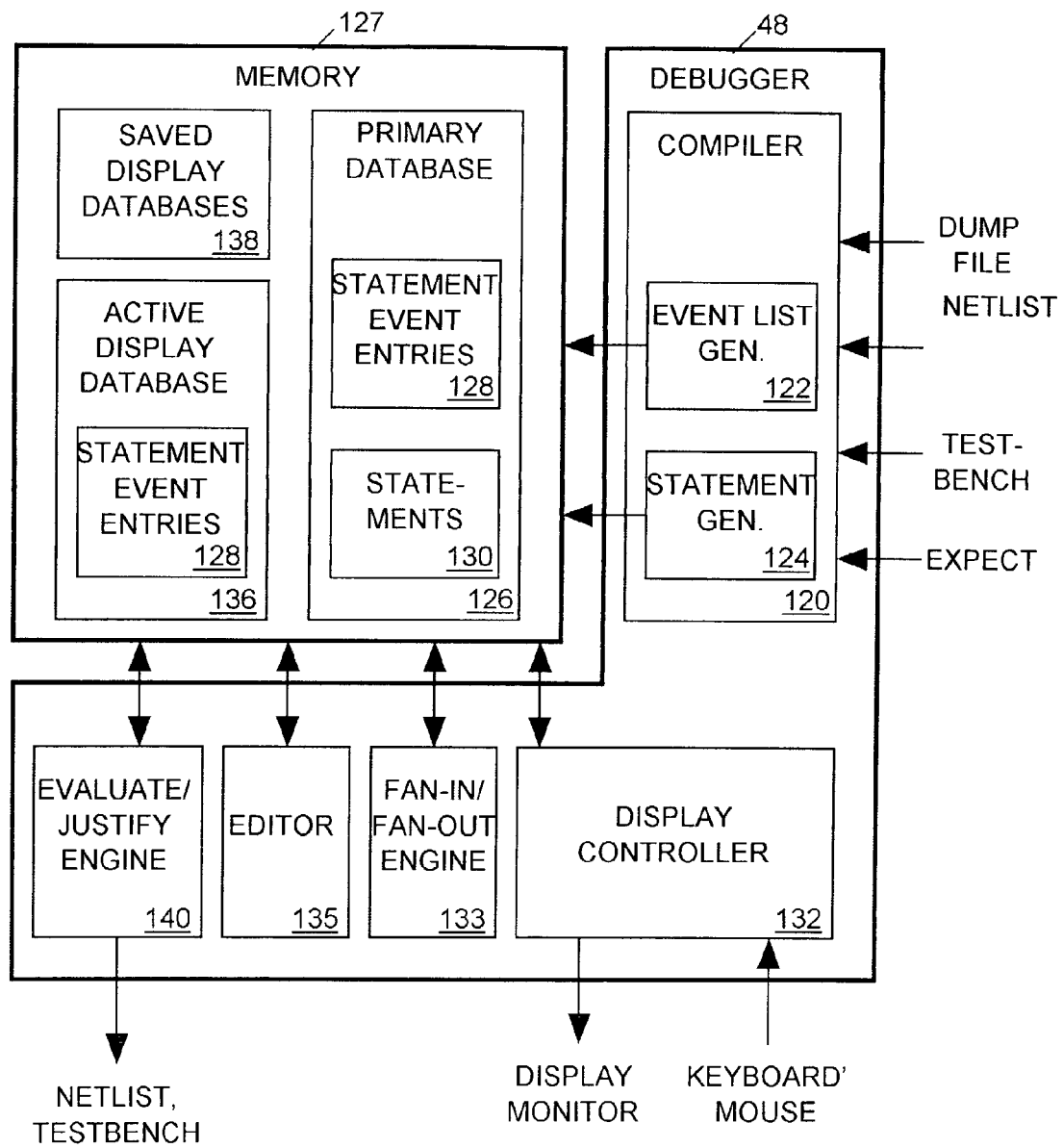
FIG. 20 is a block diagram illustrating software components implementing the debugger of FIG. 5 and data files they maintain.

FIG. 20 illustrates software components of debugger 48 of FIG. 5 and data files they maintain. Debugger 48 software includes a compiler 120 including an event list generator 122 and a statement generator 124 for processing a net list, a test bench, a dump file, and an expect file to produce a primary database 126 stored in a disk drive or memory 127.

Event list generator 122 produces a separate entry 128 in primary database 126 for each statement event. A statement event occurs when a netlist statement controlling the value of a generated circuit or testbench statement controlling the value of an input signal is evaluated. Each statement event entry 128 in database 126 contains sufficient information to permit debugger 48 to produce a statement event symbol including the name of the statement's input and output signals, the value output signal's values before and after statement evaluation, the value of each input signal before the clock edge, the type of each signal, data indicating whether each input signal influenced the output signal value, the time at which the statement event occurred, and the expected value of the statement output signal at that time, if any.

Statement generator 124 processes netlist 42 to generate a set of "statement" entries 130 in primary database 126, one for each signal. Each statement entry 130 includes a statement name, the statement's input and output signal names, the output signal's data type and permissible value range, the statement clock's name, and a representation of the function by which the statement computes the value of its output signal from values of its input signals.

A display controller 132, responding to user keyboard and mouse input, generates a display on a display monitor based on information contained in a display database 136 containing copies of only the statement event entries 128 needed to define the display 52 currently appearing on display monitor 49 (FIG. 6). Display controller 132 updates the display whenever the active display database 136 changes.

Figure 21:
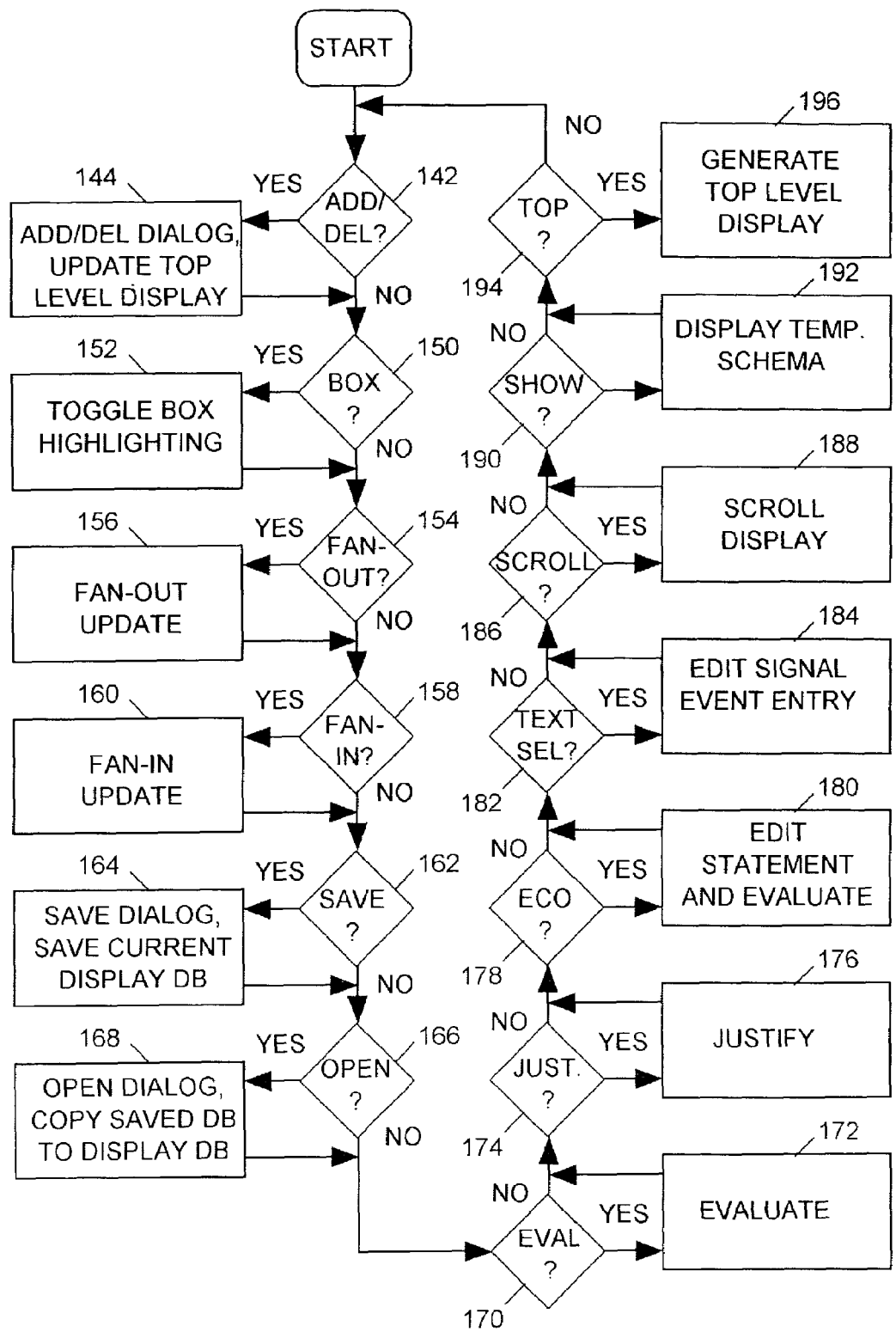
FIG. 21 is a flow chart illustrating operation of the display controller of FIG. 16.

FIG. 21 is a flow chart illustrating operations carried out by display controller 132 FIG. 16 in response to user input via mouse or keyboard. When operating in a top level display mode, display controller 132 generates the top level display (FIG. 7) depicting values of various user-selected output signals of all statement events 128 in primary database 126. When the user clicks ADD/DEL button 60 (FIG. 7) to tell display controller 132 to add a signal to or delete a signal from the top level display (step 142), display controller 132 opens a dialog window allowing the user to specify the signals to be added or deleted and then updates the top level display accordingly (step 144).

When the user clicks on a box displaying a signal value (step 150), display controller toggles the box highlight (step 152). When the user thereafter clicks the FAN-OUT button while a statement output signal box is highlighted (step 154), display controller 132 signals a fan-in/fan-out engine 133 to produce or expand a fan-out display (step 156) extending from the highlighted box. To do so engine 133 searches primary database 126 to locate each statement event entry 128 having the signal value associated with the highlighted signal box as an input signal value and copies the statement event entries into display database 136. Display controller 132 thereafter updates the display to reflect the change in the current database.

When the user highlights an statement input signal box and then clicks the FAN-IN button (step 158), invokes fan-in/fan-out engine 133 (step 160). Engine 133 parses the statement event entries 128 in primary database 126 to locate the particular statement event entry describing the statement event that generated the signal value associated with the highlighted input signal box, and then copies that statement event entry into the display database 136. Display controller 132 thereafter updates the display to reflect the change in the current database.

When the user sends a SAVE button command to display controller 132 (step 162), the display controller opens a save dialog to obtain a name for the display from the user and then saves a copy of the display database 136 in saved display database 138 (step 164). When the user clicks an OPEN button (step 166), display controller 132 opens a dialog window allowing the user to provide the name of a previously saved display, and display controller 138 responds by overwriting the display database 136 with a copy of the appropriate saved database 138 (step 168). Display controller 132 then updates the display to reflect the changes to display database 136.

When the user has selected and edited an output signal value represented by a displayed statement event symbol within a fan-in/fan-out display, and then sends an EVALUATE command to display controller 132 (step 170), the display controller evokes an evaluate/justify engine 140 and tells it to carry out an evaluate operation (step 172). To do so, engine 140 compiles testbench and netlist inputs for circuit simulator or verification tool 40 (FIG. 5). The netlist contains only the statements associated with statement event entries 128 it finds in display database 136 representing statement events in the fan-out cone of the statement event represented by the selected statement event symbol. The testbench treats output signals of all other statement events represented by displayed statement event symbols as circuit input signals. Engine 140 then invokes circuit simulator or verification tool 40 to simulate or verify behavior of the circuit described by the new netlist and test bench thereby producing a new dump file containing waveform data. Compiler 120 compiles the new dump file into new statement event entries 128, overwriting corresponding statement event entries stored in display database 136. Display controller 132 thereafter updates the display to reflect the changes in display database 136.

Compiler 120 does not write the new statement event entries 128 into primary display database 126. Since only the current data base 136 is modified in response to the evaluation dump file, the information stored in primary database 126 derived from the original simulation netlist 42, test bench 44 and dump file 46 remains available for use in generating subsequent top level and fan-out/fan-in displays based on the original circuit simulation.

Simulator or verification tool 40 can carry out the evaluate operation more quickly than it can simulate or verify the entire circuit because the netlist provided by evaluate/justify engine 140 as input to simulator or verification tool 40 for the evaluation operation covers only the relatively small portion of the circuit and only the relatively small part of the simulation time represented by the displayed portion of the fan-out cone of the changed statement event output signal.

When responding a justify command from the user (step 174), display controller 132 calls evaluate/justify engine 140 and tells it to carry out a justify operation (step 176). Engine 140 first processes display database 136 to determine which statement events are in the fan-in cone of the selected statement event output signal to be justified and to determine which of the input signals to those statement events can be considered "independent variables" affecting the signal value to be justified.

Assume for example that statement event output signal box 82 of FIG. 10 is selected when the user presses JUSTIFY button 92. The displayed fan-in cone of signal box 82 includes only statement events occurring at time 910. Only signals G, H and F at time 910 are considered independent variables for the justify operation because they reside in the fan-in code of the statement event generating the signal value in box 82 to be justified and because their values are not affected by values of any other statement event in the display.

Signal events not residing in the fan-in cone of the statement event output signal 82 to be justified are not considered independent variables for the justify operation. Thus while value of signals D–F at times 770 do not depend on any other signal values, they are not treated as independent variables for the justify operation because they are not in the fan-in cone of the statement event output signal value in the selected box 82.

However if the user had instead highlighted box 69 before clicking the JUSTIFY button, then every statement event symbol in the display of FIG. 10 will be in the fan-in cone of the selected statement event output signal value in box 69. Engine 140 would therefore select signals D–G at times 770 and 910 as independent variables for the justify operation, since all of these signals are independent variables and all are in the fan-in cone of statement event box 69.

After determining the independent variables of the evaluation operation, engine 140 saves the display database, sets one of the independent variable statement events to a new value and then carries out an evaluate operation with respect to that statement event. For example, when the user wants to justify the statement event output signal value in box 69 of FIG. 10 as having a value 54, engine 140 may initially set signal F at time 770 to a "1" instead of a "0" and then carry out an evaluation operation on the fan-out cone of signal F at time 770 to determine how the ACC signal at time 980 would be affected. If the display database 136, updated for the evaluation results, indicates that the value of statement event 69 has the desired value of 54 as a result of the EVALUATE operation, then engine 140 saves the display database indicating the results of the evaluation. Engine 140 then restores the original display database, changes another independent variable value and then repeats the evaluate process. For example it may next set H at time 770 to "1" to 0, and then program the simulator to evaluate the fan-out cone of H to determine whether statement event 69 retains the desired value 54. Engine 140 repeats this process for every possible value of every independent variable.

Whenever the statement event output signal value to be justified takes on the desired value as a result of an evaluate operation, engine 140 saves a display database reflecting results of the evaluation as one of saved display databases 138. After evaluating the result of every possible value of every identified independent variable signal in the display, engine 140 passes a list of names of display databases 138 it has created and saved to display controller 132 which can then display them to the user in the form of selectable menu items. When the user thereafter selects any one of the saved display databases, display controller 132 replaces the display database 136 with the selected saved display database 138 and updates the display accordingly.

Referring again to FIG. 21, when the user clicks the ECO button after having selected a statement event symbol (step 178), display controller 132 invokes editor 135 and tells it which statement entry 130 is to be edited (step 180). Editor 135 retrieves the statement entry from primary database 126, displays the statement on the display monitor, and then allows the user to edit the displayed statement. When the user commands editor 135 to accept the edited statement, display controller 132 then (step 180) commands evaluate/justify engine 140 to carry out an evaluate operation to update the statement event entries stored in current database 136 to reflect the effects of the edited statement. When the user selects text displayed in a statement event output signal box (step 182), display controller 132 invokes editor 135 which updates a corresponding statement event entry 128 in current database 136 to reflect any signal value change made by the user (step 184). When the user operates the display's horizontal or vertical scroll bar to (step 186), display controller 132 scrolls the display accordingly (step 188). When the user clicks the SHOW button (step 190), display controller 132 generates a temporal schema depicting the circuit structure and behavior represented by the data stored in display database 136 (step 193). When the user clicks the TOP button (step 194) display controller 132 regenerates the TOP level display (step 196).

Thus has been shown and described a debugger for enabling a user to visualize the relationship between circuit structure described by a netlist and circuit behavior described by a simulator dump file. The debugger also helps the designer to quickly determine how a change in value of a statement event can affect values of later statement events.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment of the invention depicted in the specification and drawings.

What is claimed is:

1. Computer readable media containing program instructions for causing a computer to carry out a process comprising the steps of:
   a. generating a display including a first statement event symbol representing a first statement event in which a simulator carrying out a first simulation of a circuit determined a value of a first signal of the circuit at a first simulation time, wherein the first statement event symbol references the first signal, indicates the value of the first signal at the first simulation time, and resides in the display at a position associated with the first simulation time, and
   b. for each second signal of the circuit having a value at a second simulation time that is a function of the value of the first signal at the first simulation time, responding to user input requesting a fan-out display relative to the first statement event symbol by adding a second statement event symbol to the display representing a statement event in which the simulator determined a value of the second signal at the second simulation time, wherein the second event symbol resides in the display at a position associated with the second simulation time.

2. The computer readable media in accordance with claim 1 wherein each second statement event symbol references its corresponding second signal and indicates the value of that second signal at the second simulation time.

3. The computer readable media in accordance with claim 2 wherein each second statement event symbol displays the value of its corresponding second signal at the second simulation time.

4. The computer readable media in accordance with claim 3 wherein the value of the first signal at the first simulation time is a function of values of at least one third signal of the circuit, and wherein first statement event symbol also references each third signal.

5. The computer readable media in accordance with claim 4 wherein the first statement event symbol also displays a value of each third signal.

6. The computer readable media in accordance with claim 5 wherein the process comprises the further steps of:
   c. responding to user input by altering the first statement that the simulator executed during the first statement event so that the statement describes the first value as an altered function of values of the at least one second signal,
   d. determining how the second signal value indicated by each second statement event symbol would have changed if the simulator had produced said first value in accordance with the altered function, and
   e. altering the display of each second event statement to change its indicated second signal value as determined at step d.

7. The computer readable media in accordance with claim 6 wherein step e comprises causing the simulator to carry out a second simulation of the circuit in which it generates output data indicating the value for each second signal in accordance with the altered first statement and obtaining the new value from the simulator output data.

8. The computer readable media in accordance with claim 7 wherein the second simulation comprises only those statement events which reside inside a tan-out cone of the first statement event.

9. The computer readable media in accordance with claim 1 wherein the process comprises the further steps of:
   c. altering the display in response to user input to set the value of the first signal displayed by the first statement event symbol to a new value,
   d. determining the value of each second signal if the first signal would have had said new value at the first simulation time, and
   e. altering the display to change the value of each second signal displayed by each second statement event symbol to that determined at step d.

10. The computer readable media in accordance with claim 9 wherein step d comprises
   causing the simulator to carry out a second simulation of the circuit in which it generates output data indicating the new value for each second signal and obtaining the new value from the simulator output data.

11. The computer readable media in accordance with claim 10 wherein the second simulation comprises only those statement events which reside inside a fan-out cone of the first statement event.

12. Computer readable media containing program instructions for causing a computer to carry out a process comprising the steps of:
   a. generating a display including a first statement event symbol representing a first statement event in which a simulator carrying out a first simulation of a circuit determined a value of a first signal of the circuit at a first simulation time as a function of a value of at least one second signal of the circuit at a second simulation time, wherein the first statement event symbol references the first signal and each second signal indicates the value of the first signal at the first simulation time, resides in the display at a position associated with the first simulation time, and
   b. for each second signal, responding to user input requesting a fan-in display relative to the first statement event symbol by adding a corresponding second statement event symbol to the display representing a statement event in which the simulator determined a value of the second signal at the second simulation time, wherein the second event symbol resides in the display at a position associated with the second simulation time.

13. The computer readable media in accordance with claim 12 wherein each second statement event symbol references its corresponding second signal and indicates its value at the second simulation time.

14. The computer readable media in accordance with claim 13 wherein each second statement event symbol references each signal or the circuit having a value that influences the value of the second signal referenced by that second statement event symbol.

15. The computer readable media in accordance with claim 14 wherein each second statement event symbol also displays a value of each signal of the circuit having a value that influences the value of the second signal referenced by that second statement event symbol.

16. The computer readable media in accordance with claim 15 wherein the process comprises the further steps of:
   c. altering the display in response to user input to set the first signal value displayed by the first statement event symbol to a new value,
   d. determining a value of at least one second signal at the second simulation time that would have caused the simulator to determine the first signal to be of said new value at the first simulation time, and
   e. altering the display to change a value of the at least one second signal at the second simulation time indicated by its corresponding second statement event symbol to the value determined at step d.

17. The computer readable media in accordance with claim 16 wherein step d comprises substeps of:
   d1. causing the simulator to carry out a second simulation of the circuit in which it changes the value of the at least one second signal at the second simulation time and generates output data indicating the value of the first second signal at the first simulation time, and
   d2. determining whether the simulator output data indicates the value of the first signal at the first simulation time matches the new value.

18. The computer readable media in accordance with claim 17 wherein the second simulation comprises only those statement events which reside inside a fan in cone of the first statement event.

19. The computer readable media in accordance with claim 13 wherein the process further comprises the steps of:
   c. evaluating one of the statements associated with one of the displayed second statement event symbols to compute a signal value at one of the indicated simulation times, and
   d. displaying the computed signal value as a part of at least one of the first and second statement event symbols.

20. The computer readable media in accordance with claim 19 wherein signal value computed at step c is computed during the simulation as an element of an array.

21. The computer readable media in accordance with claim 20, wherein the array is a two-dimensional array.

22. The computer readable media in accordance with claim 13 wherein a plurality of second statement event symbols are included in the display generated at step a, wherein the plurality of second statement event symbols represent evaluations of statements describing values of output signals of a plurality of tristate buffers, each of which drives a common bus.

23. The computer readable media in accordance with claim 22 wherein the process further comprises the steps of:
   c. evaluating the statements represented by the plurality of second statement event symbols to determine whether bus contention occurs at the simulation time of occurrence represented by a position in the display of the first statement event symbol, and
   d. upon determining that a bus contention occurs at the simulation time of occurrence represented by a position in the display of the first statement event symbol, displaying an indication that the bus contention occurred.

24. A behavioral analysis system for generating a display based on waveform data generated by a circuit simulator repeatedly evaluating a set of statements, the waveform data indicating values of signals of a circuit at a succession of simulation times, wherein each statement corresponds to a separate circuit signal, and wherein each evaluation of a statement determines a value of its corresponding circuit signal at one of the simulation times as a function of a value of at least one other circuit signal the behavioral analysis system comprising:
   a display monitor; and
   a computer for processing the statements and the waveform data to generate a display on the display monitor,
   wherein the display comprises a plurality of statement event symbols, each corresponding to and representing a separate statement evaluation, each referencing the circuit signal whose value was determined by the corresponding statement evaluation and indicating that circuit signal's determined value at a particular simulation time, and each positioned in the display to indicate that particular simulation time.

25. The behavioral analysis system in accordance with claim 24 wherein each statement event symbol also references each circuit signal whose value influences the value determined by the corresponding statement evaluation.

26. The behavioral analysis system in accordance with claim 25 further comprising:
   means for allowing a user to change a value of a signal referenced by one of the displayed statement event symbols, and
   means for automatically determining how evaluation of statement in a fan-out cone of the statement corresponding to said one of the displayed statement event symbols would affect values of other signals referenced by displayed statement event symbols and for then altering the referenced signal values in the display in accordance with the determined affect.

* * * * *

UNITED STATES PATENT AND TRADEMARK OFFICE
CERTIFICATE OF CORRECTION

PATENT NO. : 7,079,997 B1  Page 1 of 1
APPLICATION NO. : 10/143347
DATED : July 18, 2006
INVENTOR(S) : Yu-Chin Hsu et al.

It is certified that error appears in the above-identified patent and that said Letters Patent is hereby corrected as shown below:

Column 18,
Line 25, "tan-out" should be --fan-out--.
Line 59, "second signal" should be --second signal,--.

Column 19,
Line 38, "second" should be deleted.

Column 20,
Line 27, "circuit signal" should be --circuit signal,--.

Signed and Sealed this

Nineteenth Day of December, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,079,997 B1 | Page 1 of 1 |
| APPLICATION NO. | : 10/143347 | |
| DATED | : July 18, 2006 | |
| INVENTOR(S) | : Yu-Chin Hsu et al. | |

It is certified that error appears in the above-identified patent and that said Letters Patent is hereby corrected as shown below:

Column 18,

Line 61, "resides" should be deleted and replaced with --and resides--.

Signed and Sealed this

Thirteenth Day of January, 2009

JON W. DUDAS
*Director of the United States Patent and Trademark Office*